United States Patent
Klocke et al.

(10) Patent No.: US 7,169,280 B2
(45) Date of Patent: Jan. 30, 2007

(54) APPARATUS AND METHOD FOR DEPOSITION OF AN ELECTROPHORETIC EMULSION

(75) Inventors: John L. Klocke, Kalispell, MT (US); Kyle M. Hanson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 356 days.

(21) Appl. No.: 10/234,637

(22) Filed: Sep. 3, 2002

(65) Prior Publication Data
US 2003/0068837 A1 Apr. 10, 2003

Related U.S. Application Data

(60) Provisional application No. 60/316,461, filed on Aug. 31, 2001.

(51) Int. Cl.
*C25D 13/00* (2006.01)
*C25D 13/04* (2006.01)

(52) U.S. Cl. ............................ 204/623; 204/626
(58) Field of Classification Search .......... 204/623, 204/626
See application file for complete search history.

(56) References Cited

U.S. PATENT DOCUMENTS

| | | | |
|---|---|---|---|
| 3,935,085 A | | 1/1976 | Baker et al. |
| 3,953,085 A | * | 4/1976 | Randour ............. 305/130 |
| 5,512,154 A | | 4/1996 | Rischke et al. |
| 5,723,028 A | | 3/1998 | Poris |
| 5,779,796 A | | 7/1998 | Tomoeda et al. |
| 6,004,828 A | * | 12/1999 | Hanson .............. 438/7 |
| 6,080,291 A | * | 6/2000 | Woodruff et al. ... 204/297.01 |
| 6,267,853 B1 | * | 7/2001 | Dordi et al. ........ 204/232 |
| 6,277,262 B1 | * | 8/2001 | Akram et al. ....... 205/123 |
| 2003/0068837 A1 | | 4/2003 | Klocke et al. |
| 2004/0054905 A1 | | 3/2004 | Reader |

FOREIGN PATENT DOCUMENTS

| | | | |
|---|---|---|---|
| WO | WO 99/16936 A1 | * | 4/1999 |
| WO | WO 01/27357 A1 | * | 4/2001 |
| WO | WO-01/41191 | | 6/2001 |

OTHER PUBLICATIONS

PCT International Search Report for PCT/US02/28165, Applicant: Semitool, Inc., Dec. 10, 2002, 7 pgs.
European Search Report for EP 02 76 8797; Semitool, Inc.; dated Jan. 26, 2006; 2 pgs.

* cited by examiner

*Primary Examiner*—Kishor Mayekar
(74) *Attorney, Agent, or Firm*—Klarquist Sparkman, LLP

(57) ABSTRACT

The present invention provides a system that enables the use of electrophoretic resists in the microfabrication industry for the production of microelectronic devices and is of sufficiently high quality to be used as a replacement for, or supplement to, current photoresist deposition technology. This system enables the application of electrophoretic resists in automated equipment that meets the standards for cleanliness and production throughput desired by the microelectronic fabrication industry. The system, apparatus and method, for providing electrophoretic resist ("EPR") layers on microelectronic workpieces for the microfabrication of microelectronic devices comprises a deposition station for receiving a microelectronic workpiece and depositing a layer of electrophoretic photoresist (EPR) thereon, a workpiece handling apparatus, and a control unit coupled to the workpiece handling apparatus and the deposition station for coordinating the processing of the workpiece in accordance with a predetermined sequence and set of processing parameters.

18 Claims, 18 Drawing Sheets

APPARATUS AND METHOD FOR DEPOSITION OF AN ELECTROPHORETIC EMULSION

CROSS-REFERENCE TO RELATED APPLICATION(S)

This application claims priority to U.S. application Ser. No. 60/316,461, filed on Aug. 31, 2001.

TECHNICAL FIELD

The present invention is directed to systems and methods for processing microelectronic workpieces in the fabrication of microelectronic devices. More particularly, the present invention is directed to systems and processes for applying an electrophoretic emulsion ("EPE"), such as an electrophoretic photoresist ("EPR"), onto a microelectronic workpiece in an automated single wafer processor.

BACKGROUND

In the fabrication of microelectronic devices and micromechanical devices several layers of material are deposited and worked on a single substrate to produce a large number of individual devices. After forming the devices in and/or on the substrate, the substrate is cut into a plurality of pieces to separate the individual devices from each other. In the process of forming these devices on the substrate, layers of photoresist are deposited and worked (i.e., patterned, developed, etched, and so forth) to form the features of the devices in and/or on the substrate.

One photoresist deposition technology used in the fabrication of microelectronic devices is a spin-on resist processes in which the resist is deposited onto a spinning substrate. The resist spreads across the substrate under the influence of centrifugal force. For the creation of some devices, however, spin-on resist processes are problematic. For example, one problem of spin-on techniques is that excess photoresist may be deposited on certain portions of the substrate and/or an insufficient amount of photoresist may be deposited on other portions. Another problem of spin-on techniques is that the layer of photoresist may not conform to the topography of the features on a workpiece. This problem can be a significant concern if the resist is to cover large step heights or small features. As the devices become more complicated, the constraints of forming uniform, conformal layers of photoresist may exceed the capabilities of spin-on processes. Further, some processes require the application of thick layers of resist, but spin-on processes may not be able to deposit the resist to the required thickness. Therefore, spin-on techniques may not provide adequate results for depositing resist onto microelectronic devices in many situations.

A different photoresist deposition technique used in the manufacture of printed circuit boards is EPR deposition. The electrolytic deposition of EPR in the printed circuit board industry is normally carried out through a "rack-and-tank" type system in which the workpiece is hung vertically and both sides of the workpiece are submerged in an electrolytic bath containing the emulsion. FIG. 1 schematically illustrates a conventional rack-and-tank type system 1 for electrolytically depositing EPR onto printed circuit boards. The rack-and-tank type system 1 includes a plurality of tanks 2a–2e that include various solutions and/or emulsions 3a–3e. For example, the system 1 can include a preclean tank 2a having a preclean solution 3a, a rinse tank 2b having a rinse solution 3b, an electrolytic tank 2c having an EPR emulsion 3c, a permeate tank 2d having a permeate solution 3d, and another rinse tank 2e having a rinse solution 3e. The electrolytic tank 2c includes electrodes 4a and 4b. The system 1 also includes a rack 5 having a plurality of hangers 6 that suspend individual workpieces 7 in a vertical orientation. The hangers 6 also electrically contact conductive layers on the workpieces 7 to which the EPR is plated. In operation, the rack 5 moves the workpieces 7 through the tanks 2a–2e to preclean, rinse, deposit EPR, dip in a permeate solution, and then rinse. When the workpieces 7 are submerged in the EPR tank 2c, a voltage differential is applied to the electrodes 4a–b and the workpiece 7 causing the resist material to coat the workpiece.

Electrolytically depositing EPR has several benefits that may be useful in applications for microelectronic workpieces. First, electrolytic EPR can deposit a uniformly thick layer of resist across a workpiece. Second, electrolytic EPR deposition can form layers that conform to highly topographical surfaces. Third, electrolytic EPR deposition can form thick layers of resist with good uniformity.

The conventional rack-and-tank type systems used for printed circuit boards, however, are not suitable for integration with other automated microfabrication tools because station-to-station contamination may be problematic. For example, rack-and-tank deposition systems are relatively messy because they fully submerge both sides of the workpiece in the EPR bath. This completely coats the workpiece with emulsion, and thus there is no clean area on the workpiece for robotic transfer units to transfer the workpieces among processing stations. Furthermore, rack-and-tank type systems are prone to forming or entraining bubbles in the EPR bath during deposition. In the case of the electrophoretic deposition of a photoresist, bubbles can migrate to the workpiece and result in defects in the resist layer called "pinholes." The pinhole defects are generally 10 μm–50 μm in diameter. Areas of the workpiece having pinhole defects may not be patterned with small microelectronic structures and are thus potentially wasted areas of the workpiece. For example, even if defects occur in only 10% of the chip sites at each mask step during photolithography, less than 50% of the chips will be functional after a seven mask process is completed. Conventional rack-and-tank type EPR equipment mitigates pinholes by holding the workpiece vertically and vibrating the workpiece in the EPR bath. The vibration energy used for printed circuit boards, however, typically exceeds the force that can be safely applied to semiconductor workpieces (i.e., semiconductor wafers) and other types of delicate microelectronic workpieces.

Electrolytic EPR deposition equipment for printed circuit boards has been proposed for use in coating microelectronic workpieces in the production of microelectronic devices, such as semiconductor devices and micromachines. However, it has been generally rejected by the microfabrication industry. As the present inventors have recognized, the printed circuit board EPR deposition equipment is not suited to the close tolerance work, cleanliness, and throughput requirements typically expected in the microfabrication industry. For example, full submersion of the workpiece during EPR deposition renders conventional EPR deposition methods impractical for integration into automated, multi-stage processing tools for microelectronic device processing because the EPR will foul and contaminate the single-wafer type robotic handling equipment. Additionally, the equipment for EPR deposition is prone to the formation of bubbles during the deposition process, and the conventional system of vibrating the workpiece may break several workpieces. Other problems of using EPR deposition systems designed for processing printed circuit boards in applications for fabricating microdevices on semiconductor wafers or other types of workpieces include: (a) contamination of other processing stations; (b) additional steps for removing edge beads from workpieces; and (c) insufficient electrical contact with the workpieces.

SUMMARY

The present invention provides a system that enables the use of electrophoretic resists and other electrophoretic emulsions in the microfabrication industry for the production of microelectronic devices. Several embodiments of systems, reactors and methods of the invention can be used as a replacement for, or supplement to, current photoresist deposition technology. For example, many embodiments enable the application of electrophoretic resists in automated equipment that meets the standards for cleanliness and throughput desired by the microelectronic fabrication industry. The systems, apparatus and methods for providing electrophoretic resist ("EPR") layers on microelectronic workpieces for the microfabrication of microelectronic devices may also be employed to deposit other electrophoretic emulsions ("EPE"), such as those suitable for use as dielectrics or color filter materials for flat panel computer screens.

In one embodiment, an integrated tool comprises a cabinet, an EPE deposition station in the cabinet, a first wet processing station in the cabinet, and a workpiece handling apparatus configured to transport the workpiece relative to the EPE deposition station and the first wet processing station. The EPE deposition station of this embodiment comprises a reactor including a cup configured to contain an EPE and a workpiece holder configured to isolate at least one region of the workpiece from the EPE in the cup. The first wet processing station is configured to perform another type of process on the workpiece, such as a pre-cleaning or pre-wetting operation. The workpiece handling apparatus is configured to contact the region of the workpiece that was isolated from the EPE in a manner that mitigates contaminating the workpiece handling apparatus or other processing stations with residual emulsion. The system may include more than one deposition station and, if also provided, more than one cleaning station or cleaning stations of different configurations so as to permit different cleaning processes to be performed either before or after EPE deposition, or both before and after EPE deposition. The system may be configured to process workpieces individually and to effect EPE deposition on one side of the workpiece while minimizing or avoiding coating the opposite side of the workpiece with EPE. The system may also be configured to remove EPE deposits from the opposite side of the workpiece following EPE deposition to insure that the workpiece leaves the system with an EPE coating only on the regions desired on the face of the workpiece.

In other embodiments, the integrated tool includes an EPE deposition station having a reactor and a gas control system in the reactor. The gas control system is configured to inhibit gases from contacting a processing side of the workpiece. The deposition station may include a gas control system configured to inhibit bubbles from residing on the workpiece. For example, the gas control systems or methods of controlling bubbles can comprise: (a) rotating the workpiece during deposition; (b) agitating the electrolytic bath during deposition; (c) vibrating the workpiece during deposition; (d) creating an impinging flow of emulsion directed substantially transversely and/or parallel to the workpiece; (e) trapping bubbles in the electrolytic bath before they reach the workpiece; (e) removing bubbles from the electrolytic bath before they reach the workpiece; (g) applying a voltage to the electrode or the workpiece according to a predetermined delay; (h) providing a plurality of counter electrodes adapted to be positioned within the processing chamber and further adapted to receive a voltage potential; (i) using mechanical agitation of the bath and/or components to remove bubbles from the workpiece; (j) separating the counter electrode from the workpiece using a membrane or other member through which electrical current can flow; (k) providing a low velocity flow to allow bubbles to rise to the surface of a storage reservoir; and/or avoiding turbulence in the fluid flow. By inhibiting gases from residing on the processing side of the workpiece, the workpiece can be held substantially horizontally in the EPE so that the backside or another region of the workpiece is isolated from the EPE. This allows the workpiece to be handled for transport to and processing in other stations without fouling the equipment with EPE. Also, inhibiting gases from residing on the processing side of the workpiece produces a good quality layer on the workpiece.

DETAILED DESCRIPTION

Figure 1:
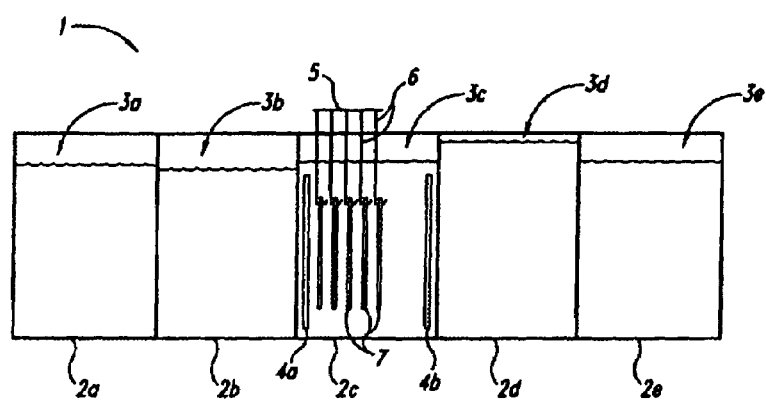
FIG. 1 is a schematic view of rack-and-tank type EPR deposition system used to deposit resist onto printed circuit boards in accordance with the prior art.

As used herein, the terms "microelectronic workpiece" or "workpiece" refer to substrates onto or in which microelectronic devices are formed, such as microelectronic circuits or components, thin-film recording heads, micromachines or micromechanical elements, data storage elements, and similar devices. Micromachines or micromechanical elements are included within this definition because the manufacturing processes that are used to make them are typically the same as or similar to the manufacturing processes used in the fabrication of integrated circuits. The substrates can be semiconductive pieces (e.g., doped silicon wafers), non-conductive pieces (e.g., various ceramic substrates), or conductive pieces. Typical workpieces are relatively thin and disk-shaped, although not necessarily circular, as ordinarily understood in the microfabrication industry.

Several embodiments of the apparatus and methods are described in the context of depositing an electrophoretic photoresist (EPR) onto a workpiece, but the present invention is by no means limited to deposition of EPR. As noted earlier, many of the following embodiments can be used to deposit suitable electrophoretic emulsions (EPEs) other than EPR emulsions. For example, other materials that can be contained in an emulsion and deposited by electrophoresis include phosphor materials for use in high resolution flat panel display devices and various selectively depositable dielectric materials. In EPE applications, the charged particles in suspension are typically "micelles" (i.e., stable organic particles suspended in the aqueous phase of the bath).

Deposition by electrophoresis in accordance with the following apparatus and methods has advantages over other methods of deposition. For example, electrophoresis is especially useful to deposit a material on three dimensional structures because it can cover even highly topographical surfaces with a conformal layer of material. Additionally, several embodiments of the following apparatus and methods can eliminate edge beading that results in spin-on or rack-and-tank deposition techniques. Furthermore, electrophoretic deposition techniques can accurately deposit much thicker layers of resist compared to spin-on techniques. Another benefit of several embodiments of the present invention is automated deposition of an electrophoretic material that enables EPR-based photolithography to be integrated with other automated semiconductor processes. Still another benefit of several embodiments of the apparatus and methods described below is that they mitigate problems caused by bubbles in the system.

AUTOMATED EPE PROCESSING TOOLS

The following description of automated processing tools provides several examples of methods and systems for performing automated EPE deposition. The automated processing tools can be integrated with additional microfabrication processing tools to form a complete microfabrication processing system in which the system includes an automated EPE processing tool. For example, it is well within the scope of the present invention to have different configurations of automated processing tools that include other types of processing stations, such as an exposure station, a chemical etching station, or metal depositing station. Such other processing stations could be contained within an enclosed or a partially enclosed housing including EPE processing stations, or they could be located in automated processing tools separate from the EPE processing stations. As explained in more detail below, the microelectronic workpieces can be transferred between the automated processing tools manually or by automatic robotic handling equipment.

Figure 2:
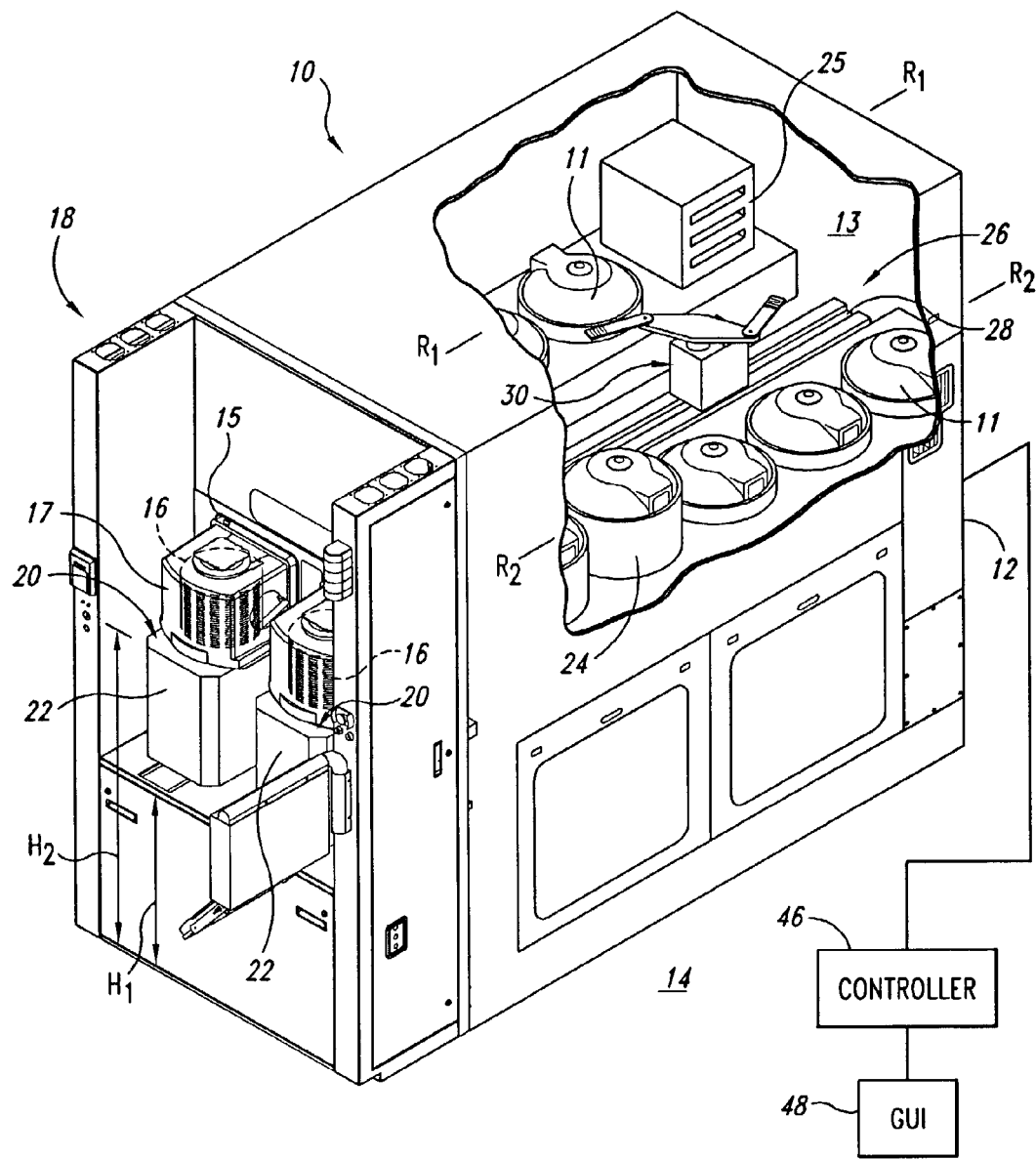
FIG. 2 is an isometric view of one embodiment of an automated microelectronic workpiece processing tool in accordance with the present invention.

FIG. 2 is an isometric view of an automated microelectronic processing tool 10 having an EPE deposition station 11 for deposition of EPR or other electrophoretic materials. The processing tool 10 may include a cabinet 12 having an interior region 13 that is at least partially isolated from an exterior region 14, such as a clean room. The cabinet 12 may be an enclosed structure including a plurality of apertures 15 (only one shown in FIG. 2) through which microelectronic workpieces 16 contained in cassettes 17 can be moved to and from a load/unload station 18. In other embodiments, the cabinet can be open, such as the layouts and tool platforms shown in U.S. application Ser. Nos. 10/080,914 and 10/080,915, which are herein incorporated by reference.

The load/unload station 18 may have one or more container supports 20 each housed in a corresponding protective shroud 22. The container supports 20 are configured to position the workpiece cassettes 17 proximate to the apertures 15 in the cabinet 12. In this position, the microelectronic workpieces 16 can be accessed by one or more robotic transfer mechanisms inside or along the cabinet 12. The workpiece cassettes 17 can be configured to house the microelectronic workpieces 16 in a "mini" clean environment in which groups of microelectronic workpieces may be transferred, automatically or manually, between processing tools. The particular embodiment shown in FIG. 2 illustrates a load/unload station suited for handling FOUP wafer holders that are typically used in connection with 300 mm semiconductor workpieces. The cassettes 17, however, can be open cassettes that do not provide "mini" clean environments. As such, other load/unload station configurations may be used depending on the characteristics of the particular type of workpiece that is to be processed in the tool 10.

The embodiments of the tool 10 shown in FIG. 2 include one or more EPE deposition stations 11, one or more fluid processing stations 24, a workpiece handling system 26, and a photoresist baking station 25. One or more of the EPE deposition stations 11 may also incorporate structures that are adapted for executing an in-situ rinse or other secondary in-situ process. Following EPE deposition, the in-situ rinse may be used to rinse the workpiece at the EPE station 11 before it is transferred to another station. In this way, cross-contamination with other reactors is reduced and the footprint of the processing tool is more efficient. Further, the in-situ rinse may be used to clean the electrodes and/or any seals that contact the workpiece during deposition. Any buildup of material on the electrodes and/or seals may thereby be removed to ensure consistent wafer-to-wafer contact. This in-situ cleaning process may be accomplished by subjecting only the electrodes to the rinse cycle without a workpiece loaded in the EPE station 11. The fluid processing stations 24 may execute one or several process sequences, such as pre-cleaning and/or pre-wetting the workpiece before EPR deposition, cleaning the workpiece after EPR deposition, developing the EPR coating following patterning, depositing a metallization layer on the workpiece, enhancing the seed layer prior to either EPR deposition or metallization deposition, and so forth.

The particular embodiment of the processing tool shown in FIG. 2 is a "linear" tool in which the processing stations are aligned in a generally linear fashion on opposite sides of the workpiece handling system 26. In this type of system, the workpiece handling system 26 includes a linear track 28 and one or more robotic transfer mechanisms 30 that travel along the linear track 28. In the particular embodiment shown in FIG. 2, a first set of processing stations is arranged in a generally linear manner along a first row $R_1–R_1$ and a second set of processing stations is arranged in a generally linear manner along a second row $R_2–R_2$. The linear track 28 extends between the first and second rows of the processing stations so that the robot unit 30 can access one or more of the processing stations along the track 28 to load and/or unload workpieces.

The robotic transfer mechanisms 26, as well as the actuatable components of the processing stations 11 and 24, are in communication with a control unit 46. The control unit 46 can implement software programming or other computer operable instructions in response to user input parameters. The control unit 46 may include at least one graphical user interface 48 including, for example, a user-friendly display through which the user input parameters are entered into the control unit 46. Optionally, the user interface may be located on an area of the tool or at a remote location. In the case of the latter implementation, the control unit 46 may also include a communicating link for communicating with the remote user interface. It will be recognized, that a number of control units 46 may be connected to a common control system (not illustrated) that is used to control and oversee the operations performed in the microfabrication facility or sections thereof. Among its many functions, the control unit 46 is programmed to control the transfer of microelectronic workpieces between the various processing stations and between the input/output section and the processing stations. Further, the control unit 46 is programmed to control the operation of the components at the individual processing stations to implement specific processing sequences in response to the user input parameters.

PROCESS CONTROL SEQUENCES

The control unit 46 can operate the processing tool 10 to deposit an electrophoretic material onto a workpiece in accordance with several different control sequences. The control sequences generally provide automated deposition of resists or other materials onto semiconductor wafers or other types of microelectronic workpieces in a manner that can be integrated with the other types of single-wafer processing equipment used in patterning microfeatures. Several embodiments of such control sequences provide automated sequences by maintaining clean surfaces on the workpiece. As such, the control sequence can use single-wafer handling equipment compatible with stepper machines and other microfabrication equipment. Several embodiments of control sequences also limit cross-contamination between the EPEs and other fluids which can reduce throughput and increase maintenance.

Figure 3:
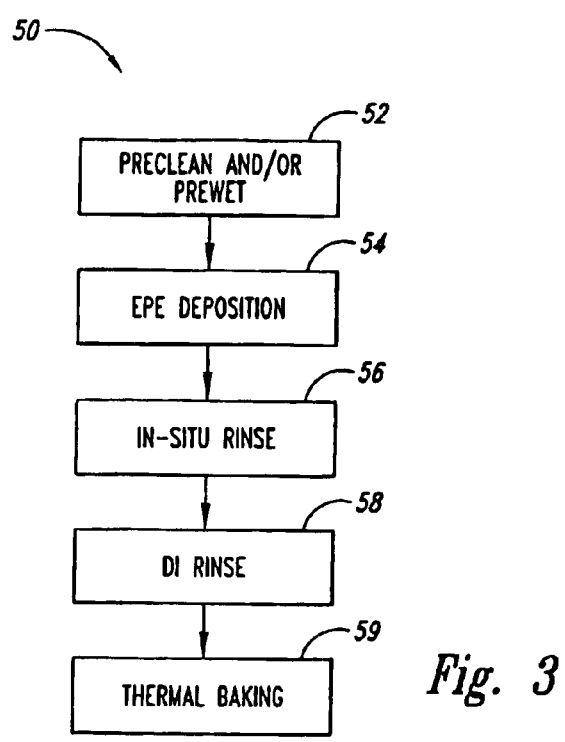
FIG. 3 is a process flow diagram illustrating one sequence of procedures in which the controller may be programmed to execute an electrophoretic deposition process.

FIG. 3 illustrates one processing sequence 50 of a number of possible sequences. The particular sequences and parameters used in the EPE deposition processes depend on the particular manufacturing processes that are to be implemented. In the illustrated embodiment of the processing sequence 50, the processing tool 10 (FIG. 2) receives a microelectronic workpiece from a cassette 17 (FIG. 2) and transfers it to one of the processing stations. The processing sequence 50, for example, can include a first fluid process 52, such as a pre-clean/pre-wetting process, in a fluid processing station 24 (FIG. 2). In an alternate embodiment, the processing sequence 50 can include a seed layer repair/enhancement procedure before the first fluid process 52 because it may be useful to enhance or otherwise deposit additional conductive material onto the microelectronic workpiece before it is subject to the pre-clean/pre-wetting process. Such enhancement or repair of the seed layer may provide better photoresist film characteristics. Methods and apparatus for processing a conductive seed layer are shown and described in U.S. Pat. No. 6,197,181, which is hereby incorporated by reference in its entirety.

After the pre-clean/pre-wetting process or other type of first fluid process 52, the control system 46 causes the robotic transfer mechanism 30 to remove the workpiece from the pre-clean/pre-wetting station and transfer it to the electrophoretic deposition station 11. At the electrophoretic deposition station 11, the sequence 50 further includes a deposition process 54 in which a microelectronic workpiece is subject to an EPE deposition process, such as depositing EPR. The specific parameters used in the deposition process 54 are input either directly or indirectly into the control system 46 by the user. It will be recognized that the particular parameters depend on the EPE type, the size of the workpiece, the type of underlying conductive layer, the thickness of the photoresist layer desired, and several other parameters.

After completing the deposition process 54, the sequence 50 includes subjecting the microelectronic workpiece to an in-situ rinse process 56 carried out in the deposition station 11. This process reduces contamination of other components because residual EPE is rinsed from the workpiece before it is loaded onto the robot 30 (FIG. 2). Further, the control system 46 may direct the execution of an in-situ contact cleaning operation at any time. This latter process assists in ensuring that there is consistent contact between the contacts used to provide electroplating power and the conductive surface on a workpiece.

After the in-situ rinse process 56, the sequence 50 further includes a second fluid process such as a rinsing process 58. For example, the control system 46 may direct the robotic transfer mechanism 30 to remove the microelectronic workpiece from the deposition station 11 and transfer it to a deionized water rinse station for executing the rinsing process 58. After the rinsing process 58, the workpiece can be removed from the tool 10 for subsequent processing. In an alternate embodiment, the sequence can optionally include a thermal process 59. For example, the control system 46 may also be programmed to direct the workpiece to a station at which the thermal process 59 is executed after completing the rinsing process 58. The thermal process 59 may include both heating and subsequent cooling of the workpiece to effectively cure the photoresist. When the thermal process 59 occurs in the tool 10, the workpiece can be removed from the tool 10 after baking and cooling the resist. As explained in more detail below, the workpiece is typically processed in additional tools for further processing the resist or other electrophoretic material deposited on the workpiece.

EMBODIMENTS OF EPE DEPOSITION REACTORS

EPE deposition reactors electrochemically deposit EPRs or other EPEs onto microelectronic workpieces. As used herein, the term "electrochemically" includes (a) electrical processes that establish an electrical field in a bath using the workpiece as an anode or a cathode and (b) electroless processes that rely on the electrochemical interaction between the workpiece and the bath without inducing an electrical field in the bath. In general, the EPE deposition reactors are suitable for microfabrication techniques used in manufacturing semiconductor devices or other micro-devices that have small features (e.g., feature sizes less than 10 microns or even less than 1 micron). Several embodiments of reactors for use in processing tools are single-wafer units that hold a workpiece at least substantially horizontally so that the EPE bath contacts only one side of the workpiece. This allows the other side of the workpiece to remain "clean" so that single-wafer handling equipment is not fouled by the EPE. Several embodiments of reactors also hold the workpiece in a manner that prevents an edge bead from forming around the perimeter of the workpiece. As explained in more detail below, the reactors are also configured to control bubbles to mitigate pinholes, and the reactors can also optionally include in-situ rinse capabilities to rinse either the microelectronic workpieces or components of the reactor to mitigate cross contamination of fluids and consumption of resist micelles.

Figure 4:
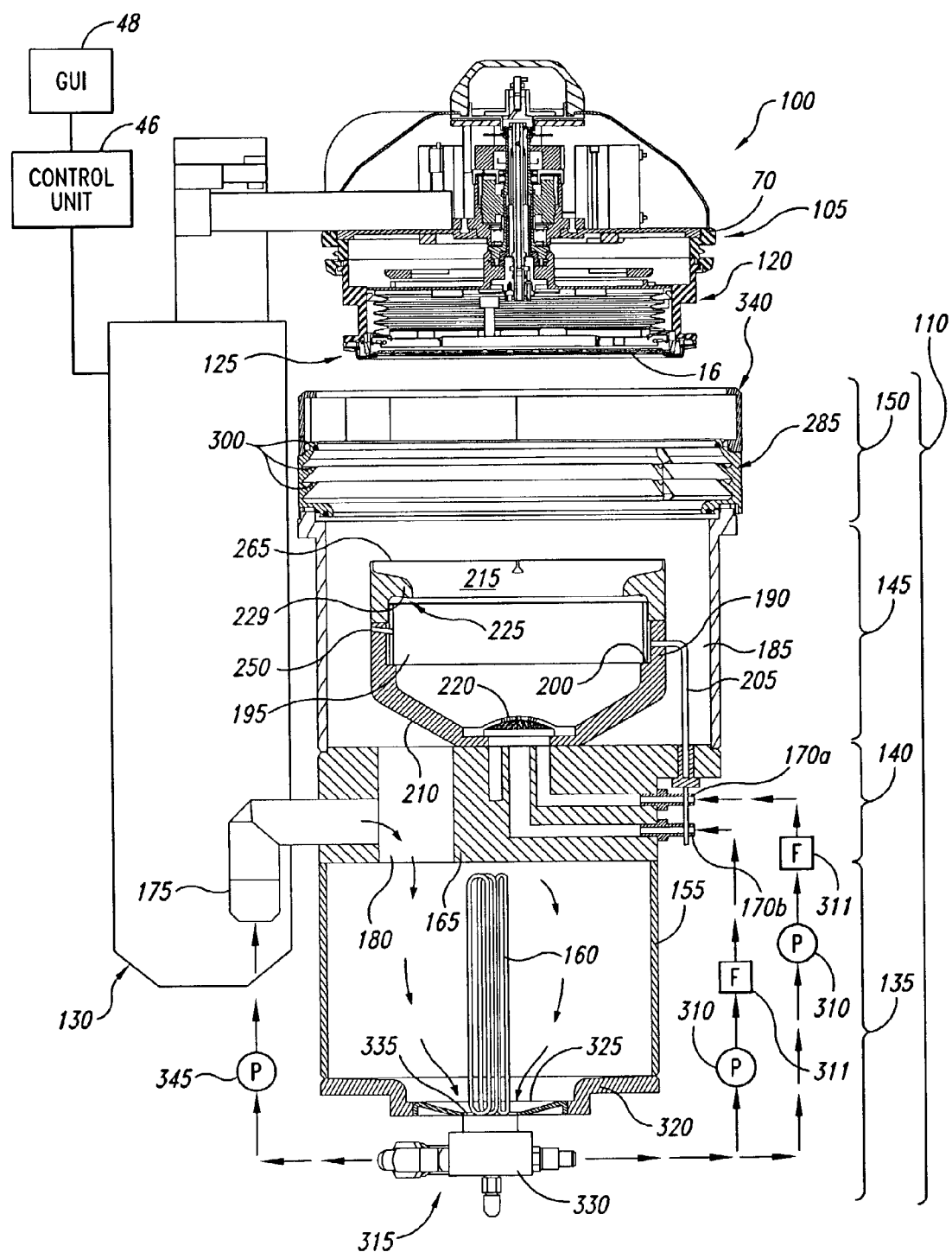
FIG. 4 is a cross-sectional view of one embodiment of a processing reactor that may be used to implement an EPE deposition process.

FIG. 4 illustrates one embodiment of a reactor assembly 100 that defines the deposition station 11 (FIG. 2) of the processing tool 10 (FIG. 2) for depositing EPEs on workpieces. Generally stated, the reactor assembly 100 comprises a reactor head 105 and a reactor base 110. The reactor head 105 includes a stator 70, a rotor 120 carried by the stator 70, and a workpiece holder 125 carried by the rotor 120. The reactor base 110 includes a processing area or vessel suitable for EPR deposition or deposition of other EPEs. The general design of the reactor depicted in FIG. 4 can also be used to implement other processing operations and, as such, can be modified for use at other processing stations within the processing tool 10. For example, the reactor assembly 100 can be modified to execute rinse/dry processes, etching processes, and electrochemical processes (e.g., electropolishing, anodization, electroless plating, electroplating, seed layer enhancement, etc.). For such other processes, the reactor base 110 may be modified to contain different chemistry and/or different chemical delivery mechanisms.

1. Reactor Bases

Reactors in accordance with several embodiments of the invention provide gas control systems to control bubbles in the EPE fluids in a manner that mitigates the formation of pinholes on the workpiece. As explained in more detail below, several embodiments of gas control systems can entrap existing bubbles before they reach the workpiece, sweep bubbles away from the workpiece, and/or prevent the formation of bubbles. In general, several different methods and devices can be used either individually or together to control bubbles in the reactor.

a. Embodiments of Reactor Base Configurations

FIG. 4 illustrates one embodiment of the reactor base 110 for depositing an EPE on the workpiece 16. In this embodiment, the workpiece 16 is positioned with respect to the reactor base 110 so that the side of the workpiece which is to be processed faces downward in a generally horizontal plane. The particular reactor base 110 shown in FIG. 4 can be functionally divided into four principal, vertically separate regions or subassemblies. A first region 135 provides an environmentally controlled reservoir of processing fluid. A second region 140 defines a fluid input/output region including channels and passageways through which processing fluids flow to and from the reactor base 110. A third region 145 defines a deposition region in which the photoresist or other electrophoretic solution/emulsion is deposited onto the workpiece 16. The third region 145 may include one or more components that reduce and/or eliminate bubbles that can cause pin-hole formations in the deposited layer. A fourth region 150 can be an in-situ secondary processing region in which the workpiece may be rinsed in-situ, the contact assembly 125 may be cleaned in-situ, or other pre- or post-deposition procedures can take place.

As illustrated, the first region 135 includes an emulsion tank 155 and a temperature control apparatus 160 disposed in the tank 155. The temperature control apparatus 160 can be an element that heats and/or cools the EPE chemistry in the tank 155. The EPE chemistry is contained and maintained at a desired temperature within the tank 155 for delivery to a processing area 215 area in the deposition region 145. The temperature control apparatus 160 may be constructed from a relatively inert material, such as stainless steel. One such temperature control apparatus suitable for use in the illustrated embodiment is available from Thermo Haake, Inc. (Paramus, N.J.).

The fluid input/output region 140 includes a chamber base 165 having several channels including a first primary chemical delivery conduit 170a, a second primary chemical delivery conduit 170b, and an emulsion return conduit 175. The chemical delivery conduits 170a and 170b are connected for fluid communication with corresponding flow channels within chamber base 165. The location and arrangement of the flow channels within chamber base 165 can be altered depending on the position of the chamber base within the reactor and the position of the reactor in the automated processing tool 10. In an alternate embodiment, the first and second conduits 170a and 170b can be at the same elevation in the chamber base 165, but extend along different radial positions. The fluid input/output region 140 also includes one or more drainage passages 180 (only one such passage shown). The drainage passage 180 may be an annular channel that is generally concentric with the center of and formed integrally with the chamber base 165.

The deposition region 145 includes an overflow cup 185 stacked vertically above the emulsion tank 155 and a concentrically disposed processing cup 190 mounted within the overflow cup 185. The overflow cup 185 can be a generally cylindrical member that peripherally surrounds the processing cup 190. Both the overflow cup 185 and the processing cup 190 may be mounted on the chamber base member 165. In the illustrated embodiment, the processing cup 190 has an annular upper structure and a tapered, frusto-conical lower portion 210 that slopes downwardly and radially inwardly. As shown, drainage passage 180 extends between the overflow cup 185 and the emulsion tank 155 so that processing fluid flowing over the rim of the upper portion of processing cup 190 flows downwardly through the overflow cup 185 and the drainage passage 180 to the emulsion tank 155. The dimensions of the overflow cup 185 may be similar to other types of reaction vessels used in wet processing tools (e.g., electroless plating reactors, etching reactors, rinse/dry capsules, etc.). As such, the reactor 100 is readily interchangeable with other reactors in designing a tool so that a single processing tool frame may be used as a basis for a wide range of different types of processing tools.

The reactor assembly 100 also includes a counter electrode 195. As shown, the counter electrode 195 is an annular ring in which the height of the material from which it is formed is greater than the width of the material. The counter electrode 195 sits upon a shelf 200 at the interior of the processing cup 190. The counter electrode 195 is coupled to one or more electrical connecting members 205 that conduct electrical power from a power supply to the counter electrode 195. The counter electrode 195 can alternatively comprise a plurality of linear or curved segments positioned around the shelf 200 of the processing cup 190.

The deposition region 145 includes a processing area 215 in which the workpiece 16 contacts the processing fluid to effect the desired photoresist deposition process. In the illustrated embodiment, the photoresist emulsion and associated solvents enter the processing area 215 through a diffuser 220 in the processing cup 190. The first delivery conduit 170a and/or the second delivery conduit 170b can provide the fluid flow to the diffuser 220.

FIG. 4 also illustrates one manner of supplying and recycling the emulsion or other type of solution in the reactor 100. As shown, a pump 310 is provided to generate the flow of the emulsion through the system. A manifold 330 is disposed in line with the pump 310 to control the flow of the emulsion. Fluid within the emulsion tank 155 flows through the inlet 335 of the manifold 330. A filter 311 can be disposed in the flow to remove particles and/or bubbles from the flow. The manifold 330 allows the emulsion to flow to one or more of the inlet conduits 170a and/or 170b that, in turn, direct the flow of the emulsion to the diffuser 220 in the cup 190. Optionally, the diffuser 220 may include a dual port system whereby emulsion from the first inlet conduit 170a provides a flow of the emulsion to holes in the peripheral portion of the diffuser 220 and emulsion from the second inlet conduit 170b provides a flow of the emulsion to holes in the central portion of the diffuser 220. The distribution of the flow between the first and second inlet conduits 170a and 170b may be tailored using one or two pumps to independently control the flows between the conduits 170a and 170b. Other manners of implementing a dual port system are also feasible.

In some circumstances, there should not be a flow of the emulsion through the diffuser 220 or otherwise through the deposition region 145. To this end, an auxiliary flow path may be provided to maintain circulation of the emulsion when the primary flow path to the deposition region 145 is closed. In the illustrated embodiment, this feature is implemented using a recirculation pump 345 that generates an auxiliary flow of emulsion through inlet 335 to the return conduit 175. This prevents the emulsion within the emulsion tank 155 from remaining stagnant when it is not being supplied to the deposition region 145 to increase the longevity of the emulsion.

b. Embodiments of Gas Control Systems

As explained above in the Background section, one problem of photoresist deposition is the accumulation of bubbles proximate the process side of the workpiece. When a workpiece is horizontally oriented in the bath in the manner shown in FIG. 4, it traps such gases on its underside because gas bubbles in the electrolytic bath tend to float the surface toward the workpiece. The bubbles entrapped on the workpiece result in pinhole-sized voids in the surface of the photoresist that significantly decrease the quality of the deposited material and thus the overall component yield. It is for this reason that conventional electrophoretic photoresist deposition processes have used systems that hold the workpiece vertically in the deposition tank. The present inventors, however, recognized several advantages of holding the workpiece horizontally. For example, one advantage of holding the workpiece horizontally is that the EPE contacts only one side of the workpiece. As such, the other side of the workpiece can be isolated from the EPE solution to remain clean for handling by the automated robotics. To obtain this advantage, the inventors developed several gas control systems that reduce and/or eliminate bubbles at the surface of the workpiece. The gas control systems are generally integrated with the reactor base 110 and/or the reactor head 105 of the reactor 100.

In several embodiments, the deposition station may include a gas control system configured to inhibit bubbles from migrating to and/or residing on the workpiece. As explained in more detail below, the gas control systems can include: (a) rotating the workpiece during deposition; (b) agitating the electrolytic bath during deposition; (c) vibrating the workpiece during deposition; (d) creating an impinging flow of emulsion directed substantially transversely and/or parallel to the workpiece; (e) trapping bubbles in the electrolytic bath before they reach the workpiece; (f) removing bubbles from the electrolytic bath before they reach the workpiece; (g) applying a voltage to the electrode or the workpiece according to a predetermined delay; (h) providing a plurality of counter electrodes adapted to be positioned within the processing chamber and further adapted to receive a voltage potential; (i) using mechanical agitation of the bath and/or components to remove bubbles from the workpiece; (j) separating the counter electrode from the workpiece using a membrane or other member through which electrical current can flow; (k) providing a low velocity flow to allow bubbles to rise to the surface of the reservoir 155; and/or avoiding turbulence in the fluid flow over the weir 265 into the reservoir 155 by keeping the fluid level in the overflow cup 185 near the weir 265 (see, FIG. 5).

In accordance with one embodiment of a gas control system, the reactor base 110 includes a chemical delivery system that provides a flow of EPE which sweeps bubbles away from the surface of the workpiece. For example, the diffuser 220 in the cup 190 can direct fluid flows from the conduits 170a and/or 170b to desired zones of the processing area 215. The diffuser 220, for example, can be configured to direct a portion of the flow to the counter electrode 195 and another portion toward the center of the workpiece 16. In the illustrated embodiment, the diffuser 220 is dome-shaped and includes a hole pattern that directs one portion of the flow to the workpiece surface and another portion toward the counter electrode 195. The portion directed toward the counter electrode 195 should flow toward the upper portion of the electrode 195 so that bubbles generated at the electrode 195 can be trapped before reaching the workpiece as explained in more detail below. The portion of the flow directed to the central portion of the workpiece sweeps bubbles proximate to the workpiece surface toward the outer periphery of the workpiece where they can escape.

In accordance with another embodiment of a gas control system, the rotor 120 may rotate the workpiece during a plating cycle to drive bubbles from the area proximate the workpiece surface. The workpiece is preferably rotated throughout a majority of the deposition cycle. The flow of photoresist chemistry impinging the workpiece surface and the rotation of the workpiece 16 combine to generate a fluid flow within the processing area 215 that moves radially outward from the center of workpiece 16. Such an outward flow physically sweeps bubbles toward the workpiece periphery where they can escape from the processing fluid. This aspect of controlling bubbles can be combined with the flow aspects of the diffuser 220.

The gas control system of the embodiment illustrated in FIG. 4 can also include structures that trap the bubbles present in the photoresist emulsion before they reach the surface of the workpiece 16. This embodiment differs from the foregoing embodiments in that it does not necessarily physically remove bubbles from the surface of the workpiece or a zone adjacent to the workpiece. Rather, this embodiment reduces the presence of bubbles in the photoresist emulsion in the area below the workpiece surface to prevent bubbles from reaching the workpiece. This effect may be achieved, in part, by directing the flow of the photoresist chemistry through the reactor base so that bubbles are trapped at a trapping area. For example, as explained above, the diffuser 220 can direct a portion of the fluid flow toward a bubble trapping region that is vertically above the counter electrode 195. Once the bubbles are trapped, they may be directed to an area remote of the workpiece. For example, they may be directed outside of the reactor base through a bubble exhaust vent, and from there to a reactor base exhaust vent.

Figure 5:
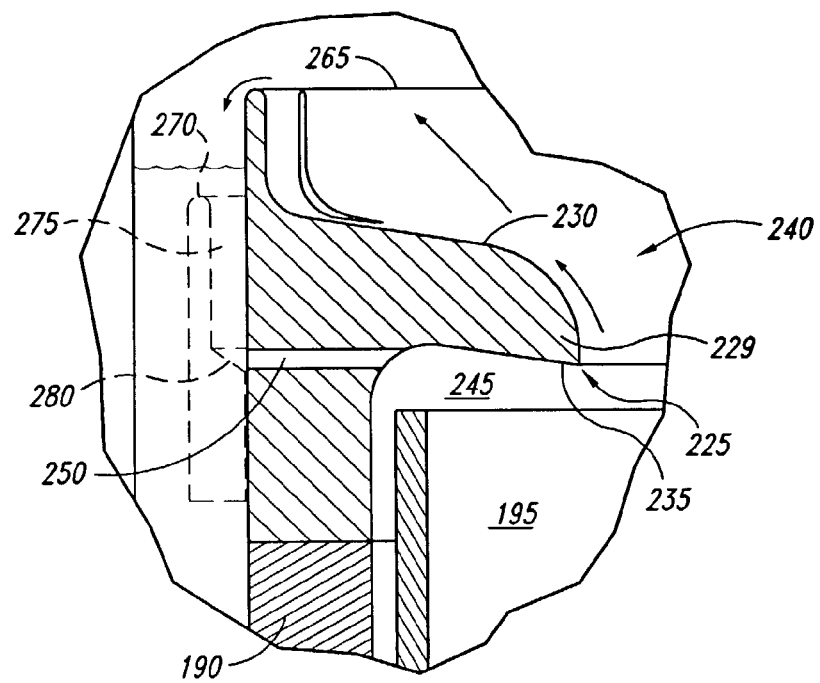
FIG. 5 is a view of a gas control system including a bubble trap and weir configuration for use in the reactor shown in FIG. 4.

FIG. 4 illustrates one embodiment of a bubble trap 225 for use in the reactor 100, and FIG. 5 illustrates the bubble trap 225 in greater detail. As shown in FIG. 4, the bubble trap 225 can be an annular component located at the top of the counter electrode 195. Referring to FIG. 5, the bubble trap 225 may include a sloped ledge 229 having an upper surface 230 and a lower surface 235. The upper surface 230 defines a flow area 240 through which the photoresist emulsion passes before reaching the processing area 215. The sloped lower surface 235 extends radially inward so that it overlies the counter electrode 195. The lower surface 235, which is radially exterior to flow area 240, can slope downwardly toward the center of the cup 190 to define a bubble trap region 245 that entraps bubbles generated at the counter electrode 195 or otherwise entrained in the fluid flow.

Figure 6:
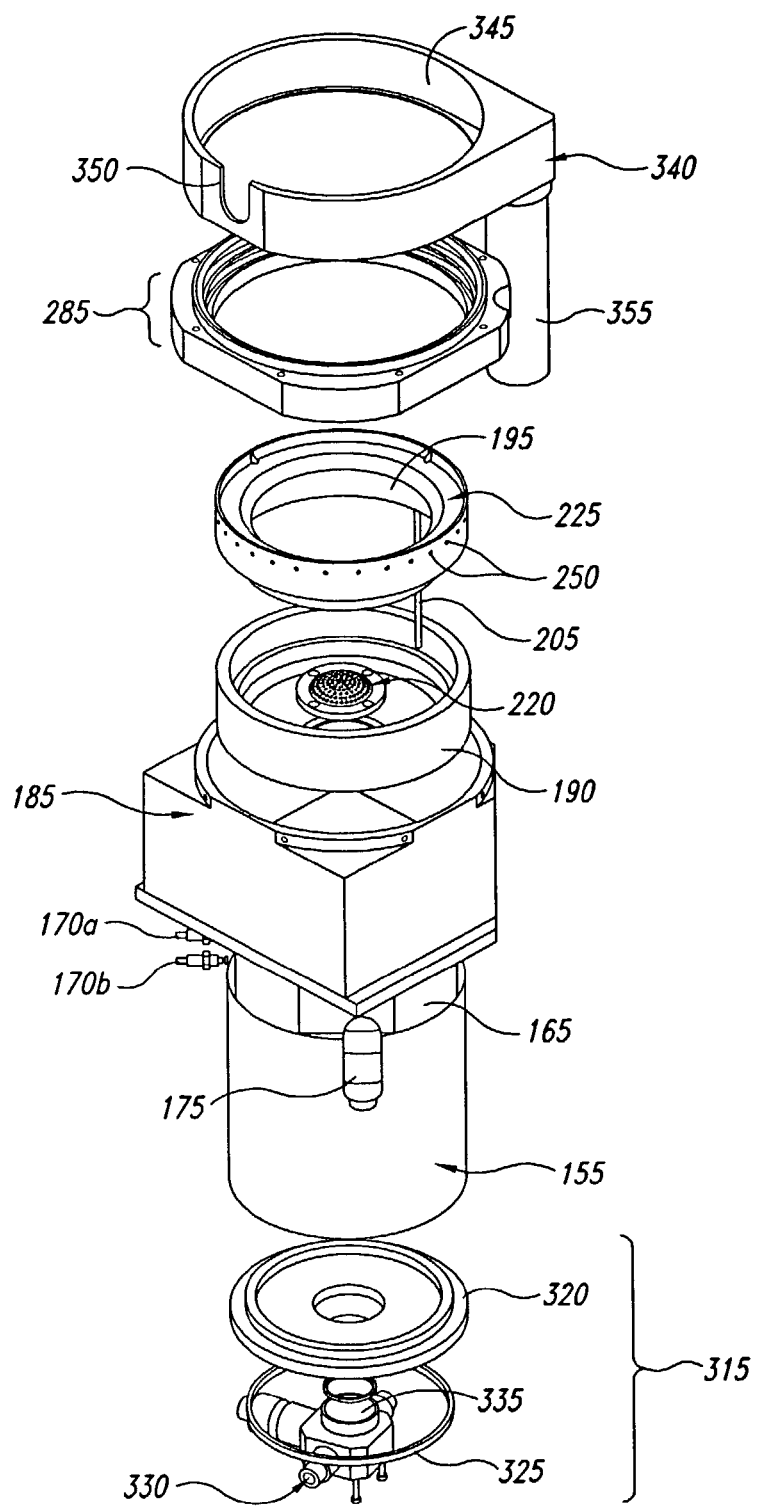
FIG. 6 is an exploded isometric view of the reactor depicted in FIG. 4.

The bubble trap 225 operates in coordination with the diffuser 220 and the shape of the counter electrode 195. During deposition, the diffuser 220 directs a portion of the photoresist emulsion radially outward over the surfaces of the counter electrode 195, which then flows upward toward the bubble trap region 245 of bubble trap 225. Without being limited to theory, it is believed that many of the bubbles present in the photoresist emulsion are generated by chemical reactions that occur at the counter electrode during EPR deposition. By directing a portion of the flow over the surfaces of the counter electrode, bubbles formed on the counter electrode are swept upward and then radially outward through the bubble trap region 245 of the bubble trap 225. The vertical sides of the counter electrode facilitate in entraining the bubbles at the electrode 195 in the upward flow of emulsion flowing toward the top 225. The bubbles swept into the bubble trap 225 can then be directed through a bubble vent 250 to remove the bubbles from the process flow in the cup 190. In the illustrated embodiment, the bubble vent 250 may be an annular channel through which the bubbles may escape. However, as shown in FIG. 6, the bubble vent 250 can be a plurality of distributed holes.

Referring to FIGS. 4 and 5, the exterior and uppermost portion of the upper surface 230 of the bubble trap 225 may define a weir 265. The photoresist chemistry in the processing area 215 flows over the weir 265 and into the overflow cup 185. The weir 265 accordingly creates an upper surface of the bath. The volume of fluid purged over processing weir 265 can equal the volume of fluid flowing through the bubble vent 250 so that the proportion of emulsion and solvent directed over counter electrode 195 substantially equals the proportion of emulsion directed toward the center of workpiece 16. A balanced flow of this kind depends on the rate at which the photoresist emulsion is introduced into the processing area 215 and the relative size and shape of the bubble vent 250. It is well within the scope of the present invention to alter the relative size of processing weir 265 and the bubble vent 250 to achieve a balanced flow so that the volume of processing fluid flowing over processing weir 265 is substantially equal to the amount of processing fluid flowing through the bubble vent 250.

In an optional embodiment shown in broken lines in FIG. 5, the bubble trap 225 can further include a bubble weir 270 extending annularly around the exterior sidewall of the processing cup 190. As shown, the bubble weir 270 includes an annulus 275 and a lower shelf 280 that extends in a radially inward direction from the annulus 275. The upper portion of annulus 275 terminates at a vertical elevation that is just slightly below the top of weir 265. The lower shelf 280 engages and seals with the exterior surface of the processing cup 190 in an area just below the bubble vent 250.

As the fluid flows through the reactor 100, the difference in elevation between the upper portion of annulus 275 and the weir 265 results in a radially outward flow of the photoresist emulsion in the interstitial region between these structures. Bubbles exiting through the bubble vent 250, therefore, travel up to the surface of the photoresist emulsion where this radially outward flow sweeps the bubbles further away from the workpiece 16. This action may assist in further reducing and/or eliminating bubbles that have already made their way to the surface of the workpiece thereby giving rise to higher product yields.

c. Embodiments of In-situ Secondary Processing

Figure 7:
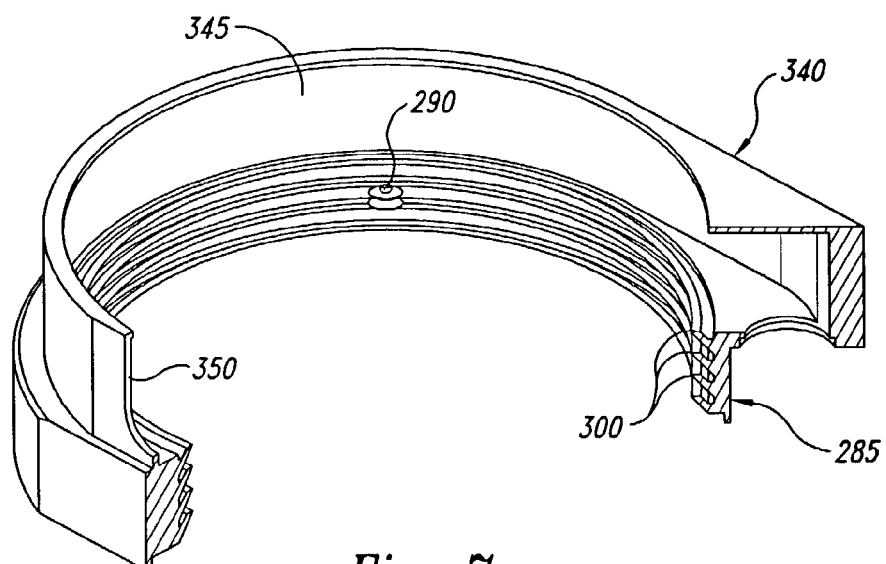
FIG. 7 is an isometric cut-away view of an in-situ rinse assembly for use in the reactor depicted in FIG. 4.

With reference to both FIGS. 4 and 7, the in-situ secondary processing region 150 of the reactor base 110 may include components for performing other processes on the workpiece and/or the contact assembly 125 at the same reactor site. Typically, such secondary processes are ancillary to the deposition process that takes place in the deposition region 145. For example, the secondary processing region 150 of the reactor base 110 may include an in-situ rinse assembly 285. FIG. 7 illustrates one embodiment of an in-situ rinse assembly 285 suitable for use in the secondary processing region 150. The in-situ rinse assembly 285 shown in FIG. 7 is described in more detail in International Application PCT/US00/28210, filed Oct. 12, 2000 and published Apr. 19, 2001 as WO 01/27357, the disclosure of which is hereby incorporated by reference.

In the illustrated embodiment, a permeate solution comprised of the continuous aqueous phase of the electrophoretic emulsion may be used to rinse the workpiece and/or the contact assembly after a deposition cycle. The in-situ rinse assembly 285 can include one or more nozzles 290 that spray the rinsing solution at the underside of the workpiece 16. The nozzles 290 can also spray the permeate solution at the electrical contact assembly 125. By rinsing the workpiece and the contact assembly with the permeate solution, residual EPE is removed from the contact assembly so that a more consistent and reliable engagement may be achieved between the electrical contact assembly and the workpiece.

This further enables automated EPE deposition because single-wafer assemblies need not be manually cleaned after only a few deposition cycles.

It is sometimes desirable, although not necessary, to at least partially inhibit mixing of the processing chemicals used in different processing steps. The reactor base 110 therefore includes a separate collection system for collecting spent permeate (e.g., permeate that has contacted one or more surfaces of the workpiece 16). The collection system can include one or more fluid channels 300 that are disposed around the inner periphery of the in-situ rinse assembly 285. As shown, the fluid channels 300 are annular lips that project radially inwardly and upwardly in the secondary processing region 150 proximate to the position of the workpiece 16 as it undergoes processing in the secondary processing portion 150.

To operate the in-situ processing system, the control system 46 causes the reactor head 105 (FIG. 4) to move the workpiece 16 to an intermediate position above the main processing area 215 but below the lower boundary of the collection channels 300. While at this position, the workpiece 16 is spun at a high rotation rate to fling off a bulk portion of any excess EPE used in the cup 190. This reduces "drag out" of EPE and waste of the photoresist. After the bulk portion of the excess EPE has been removed from the workpiece, the control system 46 causes the reactor head 105 to move the workpiece 16 to a second processing position at the elevation of the collection channels 300. In this position, a stream of permeate or other secondary processing solution is sprayed from the nozzles 290 to contact the lower surface of the workpiece 16. This spray impinges a deposited film on the workpiece 16. As the liquid stream is directed toward the workpiece surface, the rotor assembly 120 rotates at a high rotation rate so that the liquid impinging on the workpiece surface is flung radially outward under the influence of centrifugal forces. The liquid sprayed from the nozzles 290 is thus collected by the collection channels 300 where it may be reintroduced into the reservoir or removed from the reactor for recycling, disposal, etc.

The one or more nozzles 290 may direct the stream of permeate or other secondary solution at a fixed angle with respect to the horizontal plane. In such instances, the control system 46 may direct the reactor head 105 to gradually raise the workpiece as the permeate is provided through the nozzles. This creates a "chasing" effect whereby the point of contact between the permeate stream and the workpiece surface varies with the height of the reactor head 105.

The secondary processing region 150 can also include an exhaust shroud 340 above the in-situ rinse assembly 285. Referring to FIG. 6, the exhaust shroud 340 may include an annulus 345 having an opening 350 through which the arm that carries the processing head 105 (FIG. 4) may move vertically as the processing head 105 is lowered into the processing position or raised to the load/unload position. The annulus 345 opens to an exhaust vent 355 that may be connected to a pump (not shown). The exhaust shroud 340 is particularly useful for use with EPEs, such as some EPRs that contain volatile components or harmful vapors. The vapor phase of the EPE can thereby be confined to the processing base 110 to prevent contamination of the exterior environment and/or the tool region 13 of the tool 10 (See FIG. 2).

d. Additional Embodiments of Gas Control Systems

Figure 8:
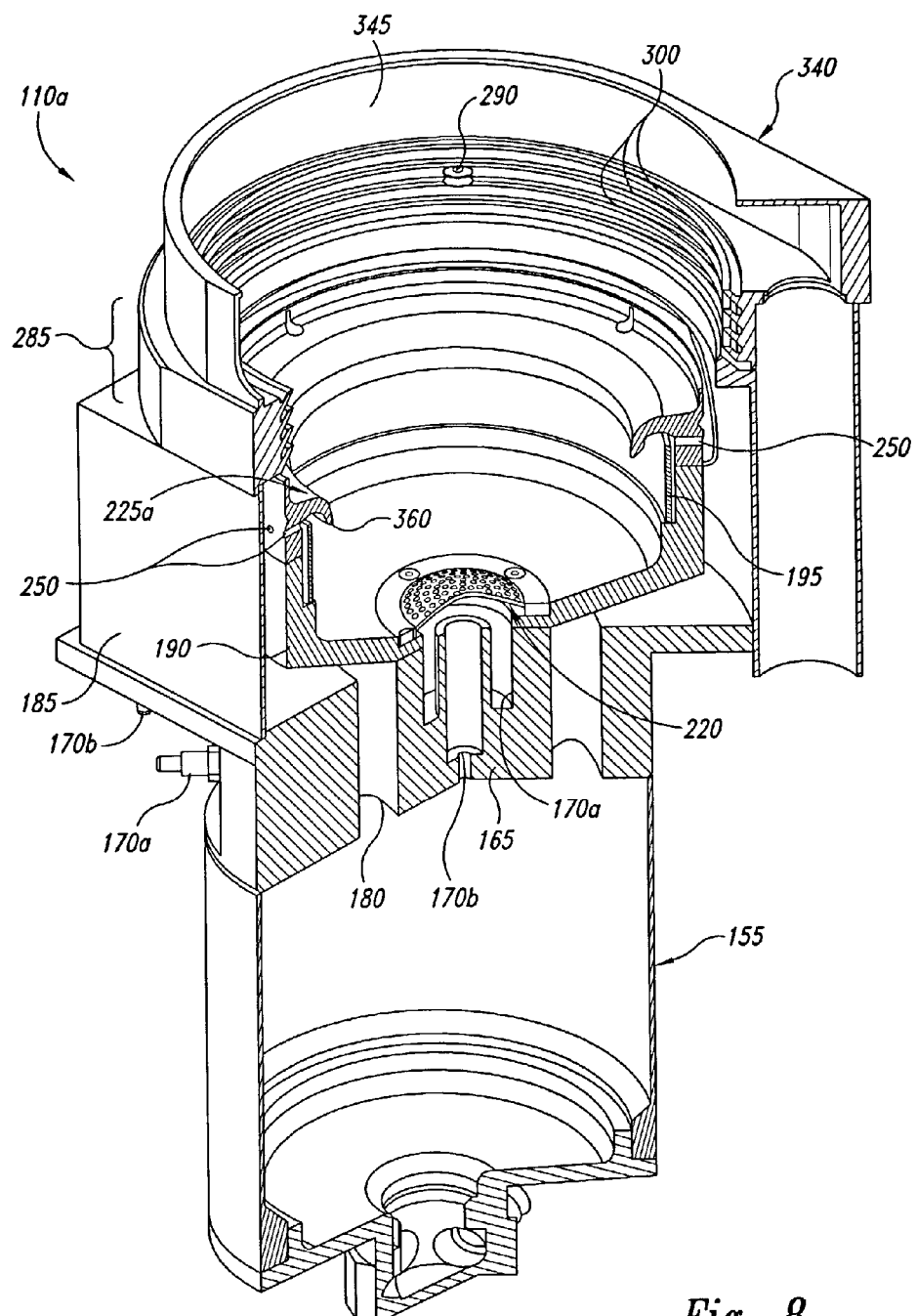
FIG. 8 is a cut-away isometric view of another embodiment of a processing base for use in a reactor to perform an EPE deposition process.

FIG. 8 is a cutaway isometric view of a further embodiment of a reactor base 110a suitable for use in the reactor 100. Similar components are labeled with the same reference numerals in FIGS. 4–8. The reactor base 110a includes a bubble trap 225a that is similar to the bubble trap 225 shown in FIGS. 4 and 5, except that the bubble trap 225a includes a ledge having a downwardly extending lip 360. The lip 360 may provide more protection against defects caused by bubbles. The inventors, however, have discovered that the radial width of the ledge and the extent that the ledge has a downwardly depending lip affects the quality of the deposited layer of resist. The size and configuration of the ledge and/or lip is a function of several factors, such as the percentage of solids in the EPE (e.g., micelle concentration), strength of the electrical field, configuration of the counter electrode, and distance between the bubble trap and the workpiece. It will be appreciated that the radial width of the ledge, the distance between the ledge and the workpiece, the extent that the lip depends downwardly, and other factors can be varied according to the specific application to provide the desired surface quality without undue experimentation.

Figure 9:
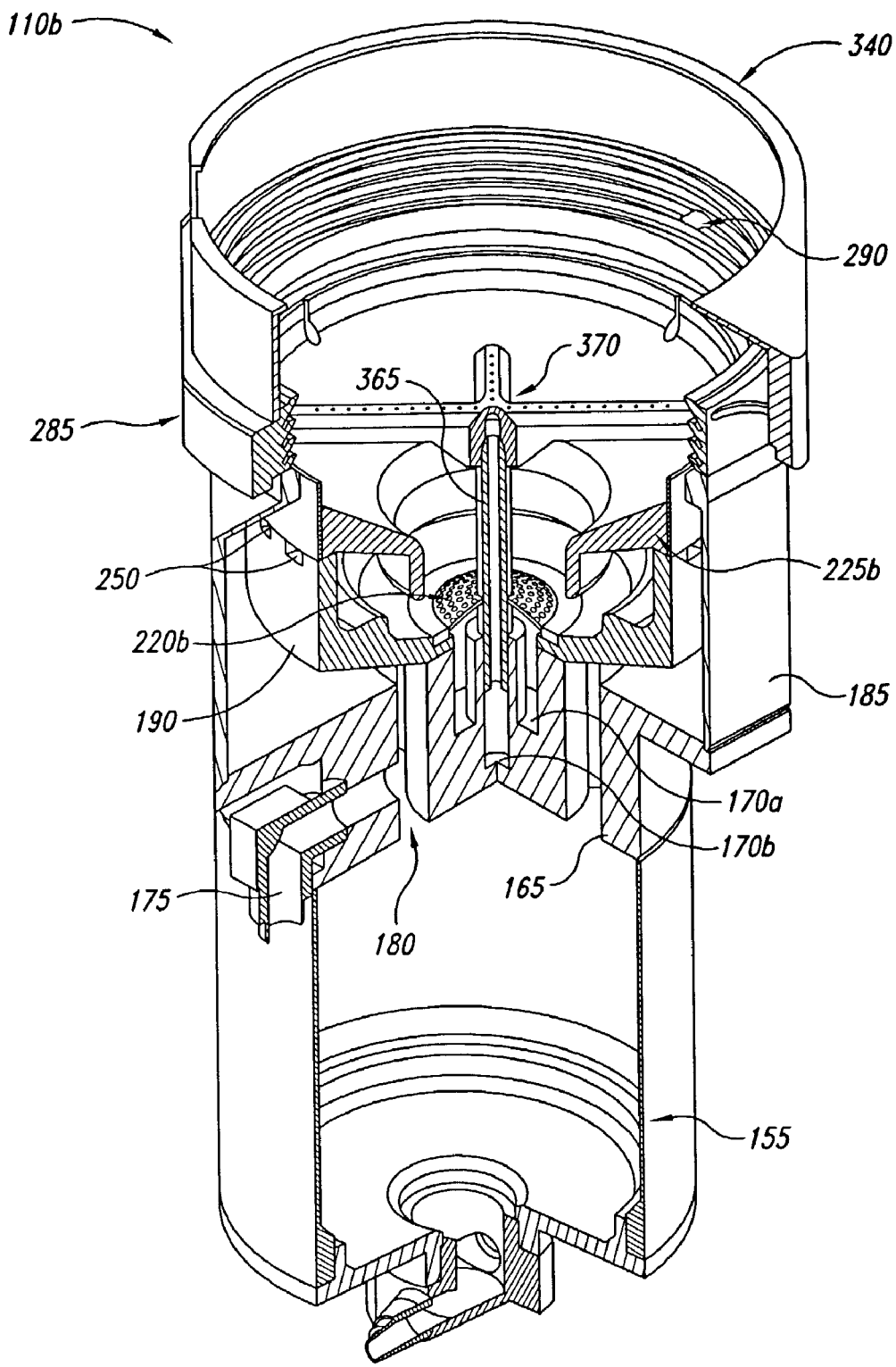
FIG. 9 is a cut-away isometric view of still another embodiment of a processing base for use in a reactor to perform an EPE deposition process.

FIG. 9 illustrates another embodiment of a reactor base 110b suitable for use in the reactor 100. Similar components are labeled with the same reference numerals in FIGS. 4–9. In this embodiment, the reactor base 110b includes a dual chemical delivery system that provides an agitated fluid flow to the surface of the workpiece that assists in driving bubbles at the workpiece surface radially outward away from the workpiece. In addition to the primary chemical delivery conduits 170a and/or 170b that direct a primary flow of the photoresist through the diffuser 220b, the reactor base 110b can further include a secondary conduit 365 and a sprayer bar 370 coupled to the conduit 365. An additional flow of photoresist chemistry is delivered to the processing area 215b through the spray bar 370, which may be disposed immediately adjacent the process side of the workpiece 16. The spray bar 370 may be configured as a cross-like structure having several linearly disposed holes on the side facing workpiece 16 for the diffusion of photoresist emulsion toward the workpiece surface. Together, the diffuser head 220b and the spray bar 370 direct an agitated flow of photoresist emulsion toward the workpiece 16 during deposition. This agitated flow, which in the illustrated embodiment is primarily directed to the central portions of the workpiece, assists in driving bubbles proximate to the workpiece surface toward the outer periphery of the workpiece where the bubbles can escape the fluid flow.

As above, the workpiece may be rotated to further assist in driving bubbles from the area proximate the workpiece surface. To this end, as the flow generated by the diffuser head 220b and the spray bar 370 impinges on the surface of the workpiece, the rotor assembly 120 (FIG. 4) rotates the workpiece. The impinging flow of emulsion toward the workpiece surface and the rotational motion of the workpiece 16 combine to generate a flow moving radially outward from the center of workpiece 16 to physically move bubbles toward the workpiece periphery.

FIG. 9 illustrates another bubble trap 225b. In this embodiment, the bubble trap 225b may have an annular cross-section in the horizontal plane and a funnel-shaped cross-section in the vertical plane. As shown, this particular shape substantially surrounds the counter electrode 195 in such a manner that nearly all of the bubbles forming on the electrode are captured by the bubble trap 225b. The particular configuration of the bubble trap 225b will depend upon the parameters explained above to ensure adequate surface quality.

Figure 10:
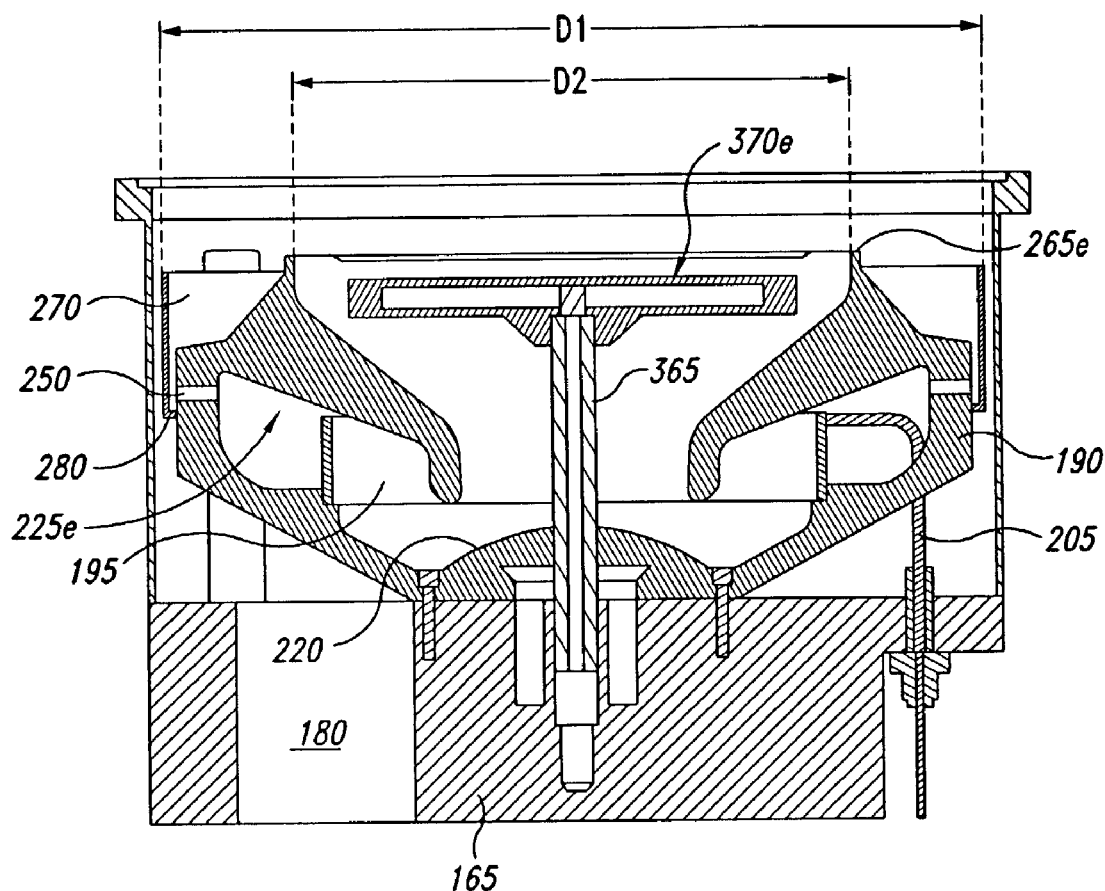
FIG. 10 is another on the embodiment of a reactor base related to the reactor base shown in FIG. 9.

FIG. 10 shows another variation of the reactor base 110b of FIG. 9 that is adapted to process a smaller diameter wafer using the same basic reactor base components. The reactor 110b shown in FIG. 10 includes a bubble trap 225e and a spray bar 370e. The bubble trap 225e has a maximum outer diameter D1 that is the same as the maximum outer diameter of the bubble trap member 225b of the reactor base shown in FIG. 9. As a result, the bubble trap member 225e of FIG. 10 and the bubble trap member 225b of FIG. 9 are effectively interchangeable inserts that can be used in the same reactor base. However, the bubble trap member 225e terminates at a process weir 265e that defines an opening having a smaller diameter D2 than the corresponding diameter of the reactor base shown in FIG. 9. This results in a virtual electrode at the opening that is smaller than the virtual electrode of the reactor base of FIG. 9. Whereas the larger virtual electrode of the reactor base of FIG. 9 may be suitable for processing of 300 mm diameter wafers, the reactor base of FIG. 10 may be tailored for processing of a smaller diameter wafer, such as a 200 mm or 150 mm wafer. Similarly, the length of the spray bar 370e in FIG. 10 is reduced in comparison to the spray bar 370 of the embodiment shown in FIG. 9 so that it can fit within the diameter D2 of the opening.

The exterior walls of the bubble trap member 225e present a sloped surface over which the electrophoretic emulsion flows as though reactor base is initially filled with fluid. In this manner, gas entrapment and bubble formation that might otherwise occur with the agitation that would result from an abrupt vertical transition over the process weir 265 may be reduced and/or completely avoided.

Figure 11:
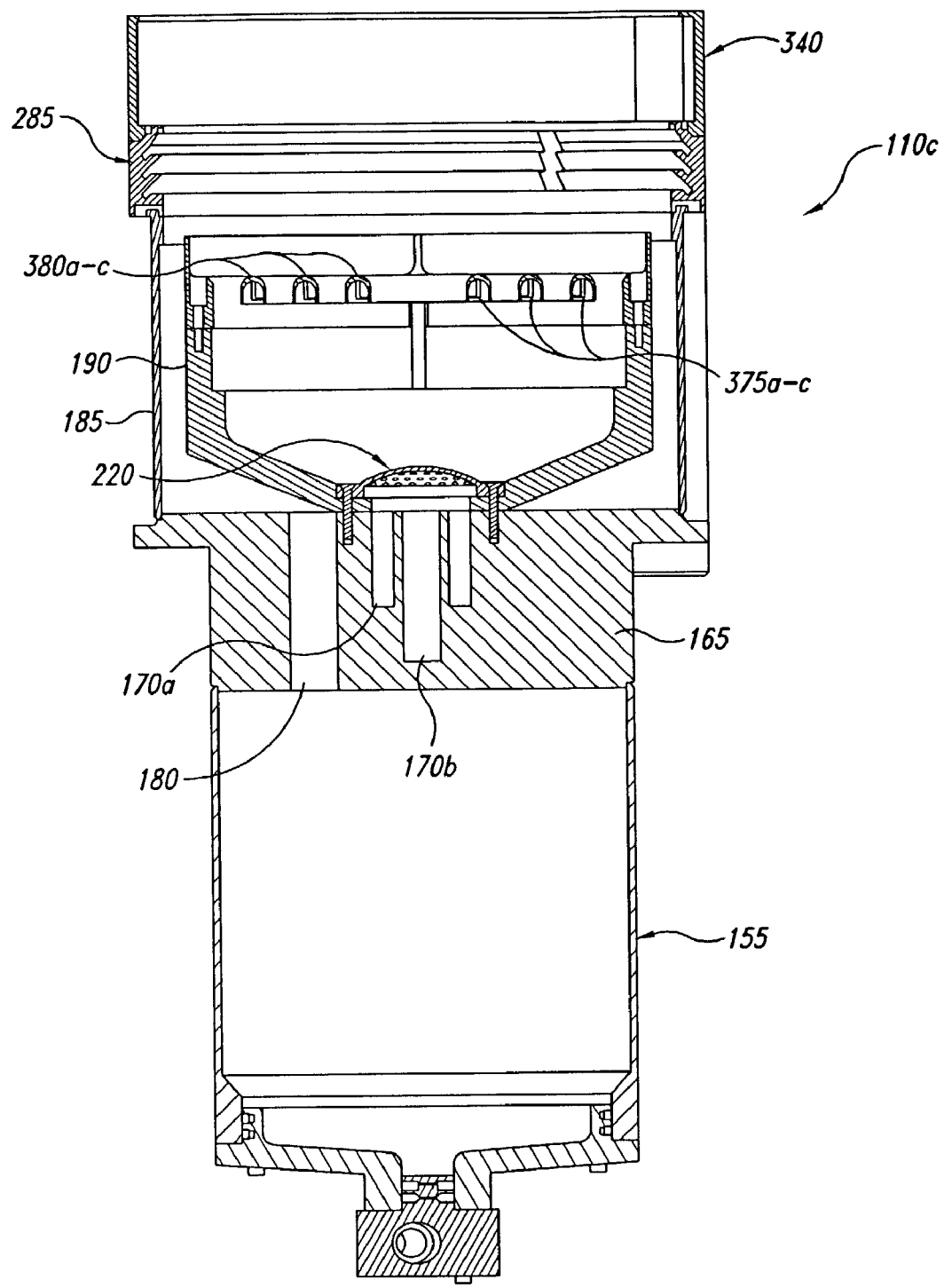
FIG. 11 is a cross-section of a reactor illustrating a still further embodiment of a reactor base.
Figure 12:
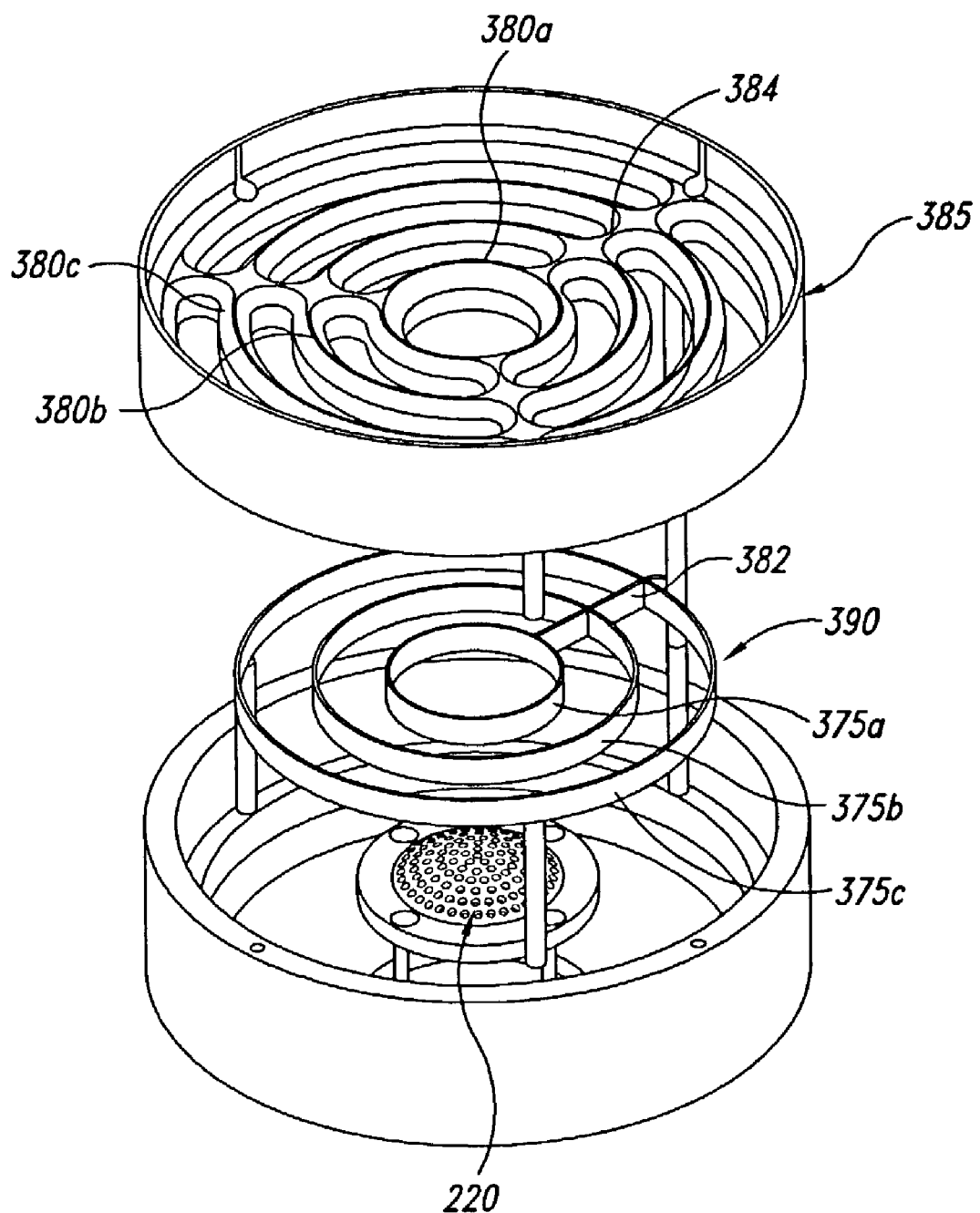
FIG. 12 is an isometric view of selected components of the embodiment shown in FIG. 11.

FIGS. 11 and 12 illustrate another embodiment of a reactor base suitable for use in reactor 100. This embodiment includes a reactor base 110c that is substantially similar to those previously described, with the exception that it includes a plurality of counter electrodes 375. In certain applications, a plurality of counter electrodes can be helpful in controlling the rate of deposition and the thickness of the resist. For example, one problem of depositing thick layers of resist is that bubbles are more likely to form. By using a plurality of counter electrodes, it may be possible to provide greater control over the rate of deposition. Such control of the deposition rate can ensure that bubbles do not get caught up in the resist layer during deposition.

In the specific embodiment shown in FIG. 11, the reactor base 110c includes counter electrodes 375a–c and corresponding bubble trapping members 380a–c immediately above the counter electrodes. The bubble trapping members 380 may be comprised of inverted U-shaped rings having an internal dimension that is just slightly larger than the width of each counter electrode 375. With particular reference to FIG. 12, the counter electrodes 375 may be interconnected with one another by a conductive or non-conductive web of material 382 to form a single counter electrode unit 390. Similarly, the bubble trap members 380 may be interconnected by webbing 384 to form a single bubble trap structure 385. In general, the principles described in relation to the reactor bases above also apply to reactor base 110c, with the exception that the flow of the emulsion from the diffuser 220 is directed up and over electrodes 375 in a manner that causes any bubbles to be trapped within trapping members 380. The bubbles can remain in the trapping members 380 or flow to a corresponding vent in the periphery of the bubble trap structure 385. The remaining parts of reactor base 110c generally operate substantially the same as described above.

Various other structures can be incorporated into the reactor to reduce and/or eliminate bubbles proximate to the surface of the workpiece 16. For example, the workpiece can be vibrated during deposition through the use of a common vibration device that is attached to the rotor assembly 120 (FIG. 4). Alternatively, the vibration device may be attached to the stator 70 (FIG. 4). In each instance, such vibration assists in preventing the bubbles from adhering to the surface of the workpiece. A suitable vibration device that may be used is a series MVS1 & MSP (3000 rpm) from Vibratechniques, Ltd. (New England House, Brighton, U.K.).

The generation of an agitated flow of photoresist emulsion at the surface of the workpiece can also be accomplished through the use of a moveable paddle. Such a paddle can be placed just below the surface of the workpiece 16 where it can oscillate to drive bubbles that are present at the surface of the workpiece toward the peripheral portions thereof. The paddle may have a triangular cross-section and may be mounted just below the surface of the workpiece in a right-side up or upside down orientation. An oscillating drive may then be attached to the paddle to effect the back-and-forth, horizontal oscillation of the paddle during the EPR deposition process. The paddle may also have holes through which the EPE can flow. Suitable paddles are similar to the plating systems disclosed in articles by Rice et al., "Copper Electrodeposition Studies With A Reciprocating Paddle," *J. Electrochem. Soc.*, vol. 135, No. 11, November 1988, Mehdizadeh et al., "The Influence of Lithographic Patterning on Current Distribution in Electrodeposition: Experimental Study and Mass. Transfer Effects," *J. Electrochem. Soc.*, vol. 140, No. 12, December 1993 and Schwartz et al., "Mass-Transfer Studies in a Plating Cell With A Reciprocating Paddle," *J. Electrochem. Soc.*, vol. 134, No. 7, July 1987.

Still another embodiment for controlling bubbles is a process for operating the reaction vessel. The present inventors have found that the use of pulsed plating current during deposition may also reduce the overall bubble content of the bath. Without being limited to the following theory, it is believed that a continuous current generates more bubbles at the counter electrodes or the workpiece surface because gas is not given time to diffuse into solution. When the electrical current is interrupted for even a brief period of time, many bubbles will simply break up and dissolve into solution. Bubbles that would otherwise inherently evolve at the workpiece surface or the counter electrode during the deposition, such as $O_2$ or $H_2$ bubbles, may not form at the electrode or the workpiece. Still further, an ultrafiltration system can be used to remove some gas bubbles and prevent the same from entering the electrolytic bath with introduction of the photoresist emulsion. For example, filters 311 (FIG. 4) can remove bubbles, or other filters in the system for filtering permeate solution can be used to remove bubbles.

Although not required, it is useful to employ one or more of the gas control systems described herein in a combined manner to achieve the desired result. For example, in view of the teachings herein, it is possible to combine ultrafiltration, rotation of the workpiece, agitation of the bath, vibration of the workpiece, impinging flow, short distance from the overflow weir 265 to the fluid level in the overflow cup 185, and bubble traps in the same reactor to produce relatively void-free photoresist films.

2. Reactor Heads

Reactor heads for use in EPE reactors in accordance with several embodiments of the invention mitigate pinholes formed by bubbles in the EPE bath and enable the integration of electrochemical deposition of EPRs and other EPEs in microfabrication processes. One feature of the reactor heads that mitigates pinholes is that the reactor heads are configured to rotate the workpiece during the electrochemical processing. Additionally, as explained in more detail below, several embodiments of reactor heads enable the integration of electrochemical EPE deposition with other microfabrication processes because the reactor heads are configured to limit the contact between the workpiece and the EPE bath to only selected processing regions of the workpiece so that other regions of the workpiece are isolated from the EPE bath. As such, single-wafer handling equipment used in other microfabrication techniques can be used to handle workpieces processed by the EPE reactors. A reactor head that is suitable for use in the illustrated reactor is described in International Patent Application Nos. PCT/US99/15847 and PCT/US99/15850, the disclosures of which are hereby incorporated by reference.

Referring back to FIG. 4, the illustrated embodiment of the reactor head 105 for the reactor assembly 100 includes a stator assembly 70 and a rotor assembly 120. The reactor head 105 receives and carries an associated microelectronic workpiece 16, positions the microelectronic workpiece 16 in a process side down orientation within the processing area 215 of the base 110 and rotates or spins the workpiece 16. The reactor head 105 also includes the contact assembly 125 with contacts that engage the electrically conductive surface of the workpiece 16 to electrically couple the workpiece to a voltage potential. The contact assembly 125 also includes structures that effectively isolate the non-processed side ("backside") or other regions of the workpiece from fluids used during the deposition process. This is in contrast to the rack-and-tank EPR processes used in printed circuit board manufacturing that immerse the entire workpiece vertically in the electrolyte causing both sides of the workpiece to be covered with the photoresist.

The reactor head 105 may be mounted on a "lift and rotate" apparatus 130 configured to rotate the reactor head 105 from an upwardly facing disposition in which it receives the microelectronic workpiece 16 (not shown) to a downwardly facing disposition in which the surface of the microelectronic workpiece 16 may be brought into contact with the photoresist chemistry contained in the EPR base 110 (shown in FIG. 4). As explained above, the robot unit 30 (FIG. 2) can load the microelectronic workpiece 16 on the rotor assembly 120 for processing and remove the microelectronic workpiece 16 from the rotor assembly 120 after processing. A reactor head that is suitable for use in the illustrated reactor is described in International Patent Application Nos. PCT/US99/15847 and PCT/US99/15850, the disclosures of which are hereby incorporated by reference.

A wide range of electrical contact assemblies 125 may be used in the processing head 105. Several suitable contact assemblies are disclosed in International Application PCT/US99/15847 and U.S. Pat. No. 6,080,291, the disclosures of each are incorporated by reference in their entirety. One embodiment of the contact assembly 125 is shown in more detail in FIGS. 13–14. The contact assembly 125 is removably attached to the rotor assembly 120 and provides electrical contact between the microelectronic workpiece 16 and a source of electrical power. In the illustrated embodiment, electrical contact between the workpiece 16 and the contact assembly 125 occurs at a large plurality of discrete flexure contacts 425 (FIG. 14) that are effectively separated from the EPE when the workpiece 16 is loaded in the contact assembly.

Figure 13:
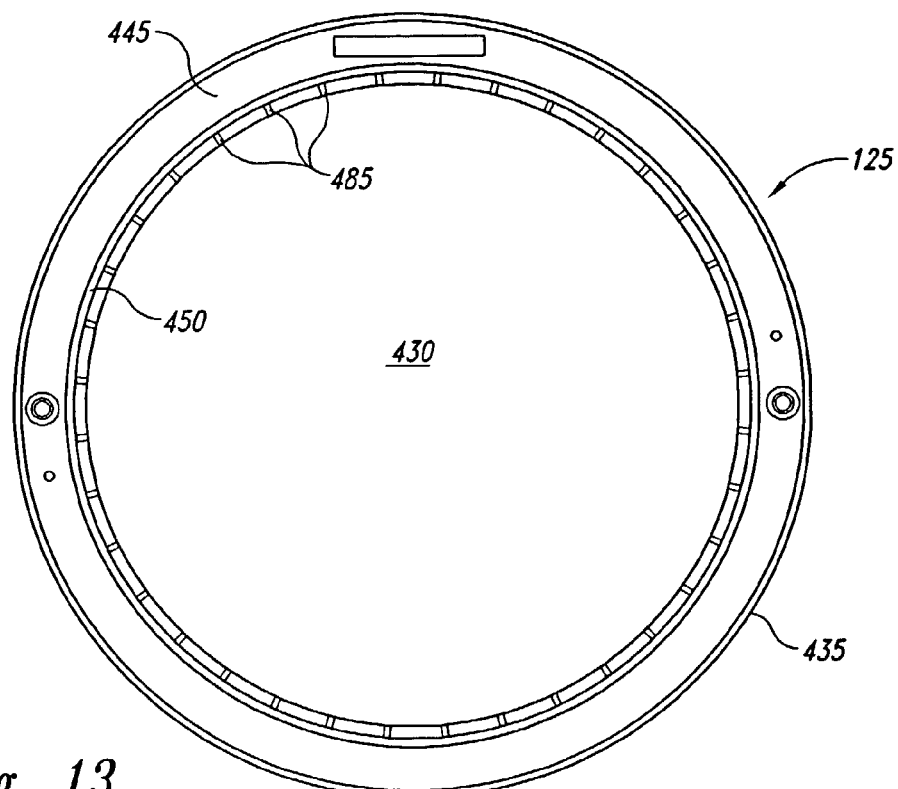
FIGS. 13 and 14 illustrate one embodiment of an electrical contact assembly that may be used in an embodiment of the reactor.
Figure 14:
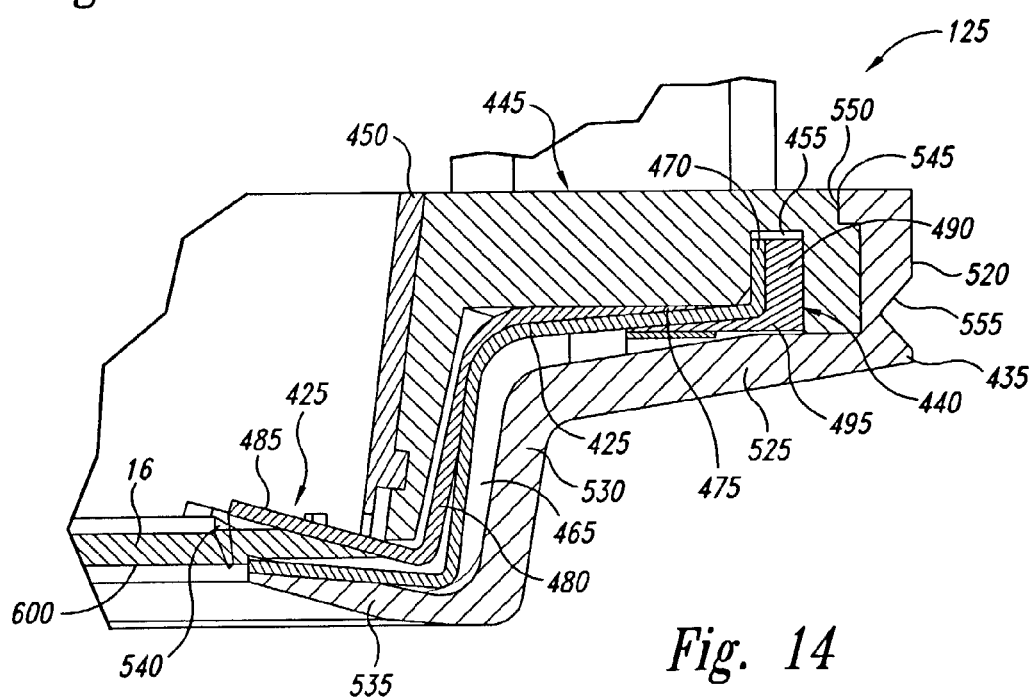

Referring to FIG. 13, the contact assembly 125 can have a central open region 430 within which the workpiece is exposed. As shown in FIGS. 13 and 14, the contact assembly 125 includes a primary support member 445, an outer body member 435 carried by the support member 445, a plurality of flexure contacts 425 projecting radially inwardly from the support member 445, and an interior wafer guide 450 on the interior of the support member 445. Referring to FIG. 14 alone, the contact assembly 125 can further include an annular wedge 440 that secures the flexural members 425 to the support member 445. The annular wedge 440, the flexure contacts 425, and the support member 445 are preferably formed from platinized titanium; the wafer guide 450 and the outer body member 435 are preferably formed from a dielectric material that is compatible with the processing environment.

FIG. 14 shows one embodiment of a flexure contact 425 in greater detail. The flexure contact 425 can include an upstanding portion 470, a transverse portion 475, a vertical transition portion 480, and a wafer contact portion 485. Similarly, the wedge 440 includes an upstanding portion 490 and a transverse portion 495. The upstanding portion 490 of the wedge 440 and the upstanding portion 470 of the flexure contact 425 are secured within a first annular groove 455 of the support member 445. In operation, a workpiece is centered to rest on the wafer contact 425. The contact portions 485 contact a perimeter portion of the workpiece around a first diameter.

The outer body member 435 includes an upstanding portion 520, a transverse portion 525, a vertical transition portion 530, and a further transverse portion 535 that terminates in a lip 540. The upstanding portion 520 includes an annular extension 545 that extends radially inward to engage a corresponding annular notch 550 disposed in an exterior wall of the support member 445. The transverse portion 535 extends radially inward beyond the contact portions 485 of the flexure contacts 425. The transverse portion 535 and contacts 425 resiliently deform as a wafer is driven downwardly through the central opening. With the workpiece 16 in proper engagement with the contact portions 485, the lip 540 engages workpiece 16 and provides a barrier between the processing solution and the outer peripheral edge of the workpiece, the backside of workpiece, and the flexure contacts 425. A seal, such as a polymeric material, can extend around the lip 540 to prevent EPE from leaking into the region of the contacts 425 or around the backside of the workpiece. The outer number 435 accordingly isolates the backside and peripheral portion of the processing side of the workpiece 16 from the EPE. As such, the backside remains clean and the edge is not covered by an edge bead of resist.

Although the flexure contacts 425 shown in FIGS. 13–14 are discrete components, they may be joined with one another as an integral assembly in other embodiments. For example, the upstanding portions 470 of the flexure contacts 425 may be joined to one another by a web of material, such as platinized titanium, that is either formed as a separate piece or is otherwise formed with the flexures from a single piece of material. The web of material may be formed between all of the flexure contacts or between select groups of flexure contacts. For example, a first web of material may be used to join half of the flexure contacts (e.g., 18 of the flexure contacts in the illustrated embodiment) while a second web of material is used to join a second half of the flexure contacts (e.g., the remaining 18 flexure contacts in the illustrated embodiment). Different groupings are also possible.

ADDITIONAL FLUID PROCESSING STATION FOR INTEGRATED TOOLS

Figure 15:
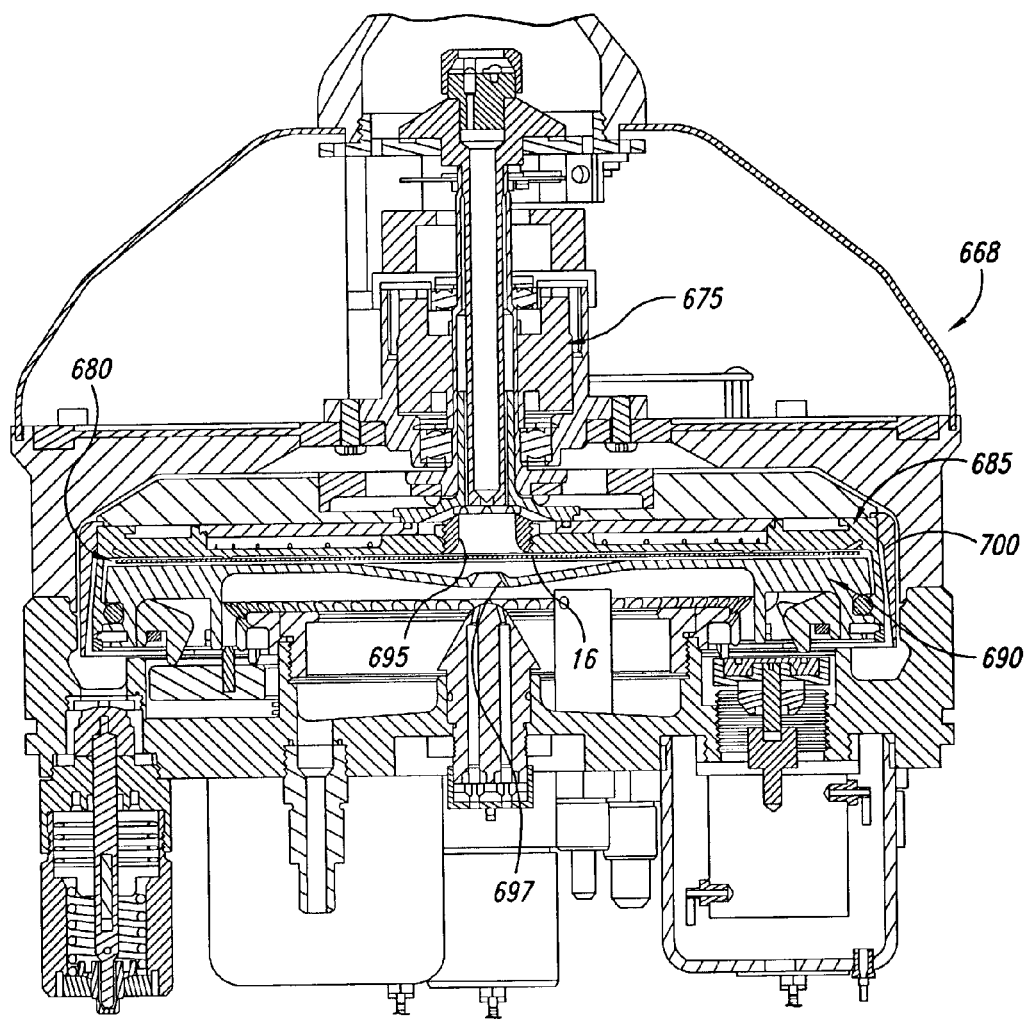
FIG. 15 is a cross-sectional view of one embodiment of a wet processing station that may be used to execute processes that are ancillary to the material deposition from the electrophoretic emulsion.
Figure 16:
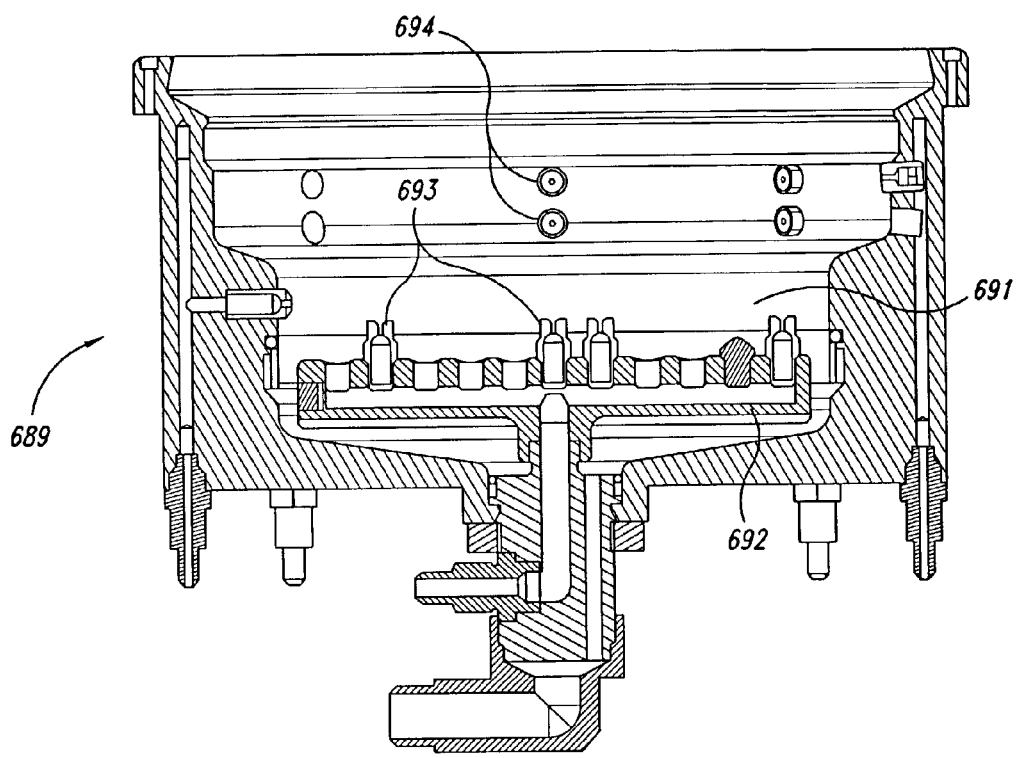
FIG. 16 is a cross-sectional view of another embodiment of a wet processing station that may be used to execute processes that are ancillary to the material deposition from the electrophoretic emulsion.

The other fluid processing stations 24 (FIG. 2) for use in performing other fluid process can include rinsing, cleaning and etching stations. Because the contact assembly 125 (FIG. 4) protects the backside of the workpiece 16 when it is held horizontally in the cup 190 (FIG. 4), the robot unit 30 (FIG. 2) can handle clean portions of the workpiece for automated processing in other stations of the tool 10 (FIG. 2). For example, the pre-clean and pre-wet process 52 (FIG. 3) and the deionized water rinse process 58 (FIG. 3) of the control sequence 50 (FIG. 3) may be carried out in a capsule reactor of the type depicted generally at 668 in FIG. 15 and disclosed in "Microenvironment for Microprocessing a Workpiece," PCT/US99/05676 filed Mar. 15, 1999 and in "Selective Treatment of a Microelectronic Workpiece," PCT/US99/05674 filed Mar. 15, 1999, both of which are hereby incorporated by reference. This basic reactor type can be used to perform a variety of processes in the automated EPR processing tool. Referring to FIG. 15, the chamber is in the form of a processing capsule that can perform cleaning, stripping, bevel etching, rinsing and drying. In the illustrated embodiment, the fluid processing capsule includes a rotor motor 675 connected to rotate a microelectronic workpiece housing 680. The microelectronic workpiece housing 680 defines an at least partially closed processing chamber in which one or more processing fluids are distributed across at least one face of the microelectronic workpiece by centrifugal acceleration generated during rotation of the housing.

The microelectronic workpiece housing can include an upper chamber member having a fluid inlet opening and a lower chamber member having a fluid inlet opening. The upper chamber member 685 and the lower chamber member 690 are joined to one another to form the substantially closed processing chamber. The processing chamber generally conforms to the shape of the microelectronic workpiece and includes at least one fluid outlet disposed at a peripheral region thereof. At least one microelectronic workpiece support is provided. The support is adapted to support a microelectronic workpiece 16 in the processing chamber in a position to allow centrifugal acceleration distribution of a fluid supplied through the inlet opening 695 of the upper chamber member across at least an upper face of the microelectronic workpiece when the microelectronic workpiece housing is rotated. The workpiece 16 is further positioned by the support to allow centrifugal acceleration distribution of a fluid supplied through the inlet opening of the lower chamber member across at least a lower face of the microelectronic workpiece 16 during rotation. The at least one fluid outlet 700 is positioned to allow extraction of fluid in the processing chamber through the action of centrifugal acceleration. If desired, a further processing fluid may also be provided to the lower face of the workpiece 16 through aperture 697.

When the capsule is used for developing photoresist (i.e., stripping away that portion in a positive photoresist that is exposed) a suitable developer for the specific photoresist chemistry can be used to remove the exposed layer of positive photoresist. Suitable developing chemicals for use with PEPR™ 3050 are available from the Shipley Company (Newton, Mass.). Moreover, DI water and photoresist emulsion can be used to preclean and prewet the workpiece prior to EPR deposition. Finally, the chamber can be used to dry the workpiece as needed throughout EPR.

Figure 17:
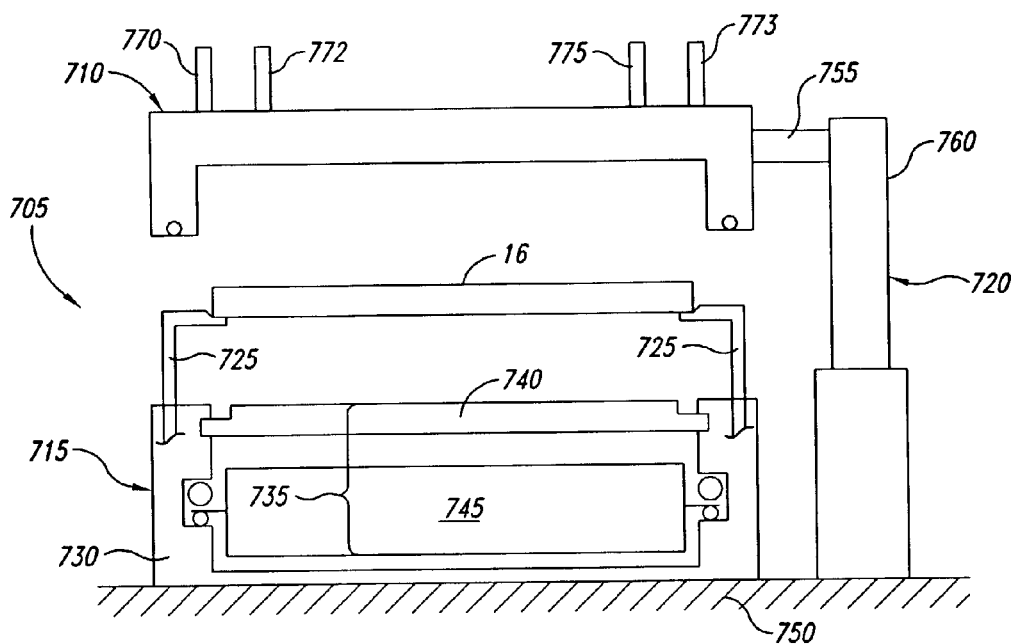
FIGS. 17 and 18 illustrate one embodiment of a thermal processing station that may be incorporated into the processing tool of FIG. 2.

FIG. 17 illustrates another embodiment of a fluid processing station 689 that can be one of the processing stations in the tool 10 (FIG. 2). The fluid processing station 690 is a rinse station having a chamber 691 and a spray bar 692 in the chamber 691. The spray bar 692 can have a plurality of nozzles 693 that direct a spray upward toward a rinsing location for a workpiece. The processing station 690 can further include a plurality of upper nozzles 694 positioned around the perimeter of the chamber 691. In operation, a processing head similar to the reactor head 105 positions a workpiece in the chamber 691. A processing solution, such as DI water or another cleaning solution, is then sprayed onto the workpiece through the nozzle 693 and 694.

THERMAL PROCESSING STATIONS FOR PHOTORESIST BAKE

In addition to the deposition stations and other fluid processing stations, the tool 10 (FIG. 2) can include the thermal processing station 25. The thermal processing station 25 can bake the photoresist onto the workpiece 16. Such stations may be as simple as a standard aluminum pedestal heater, such as, for example, a model WR200 available from Watlow, Inc. Other stations can be small ovens with a plurality of slots for independently backing, annealing or otherwise heating the workpieces. The tool 10 can also include a cooling rack to hold the workpieces after a baking cycle.

Figure 18:
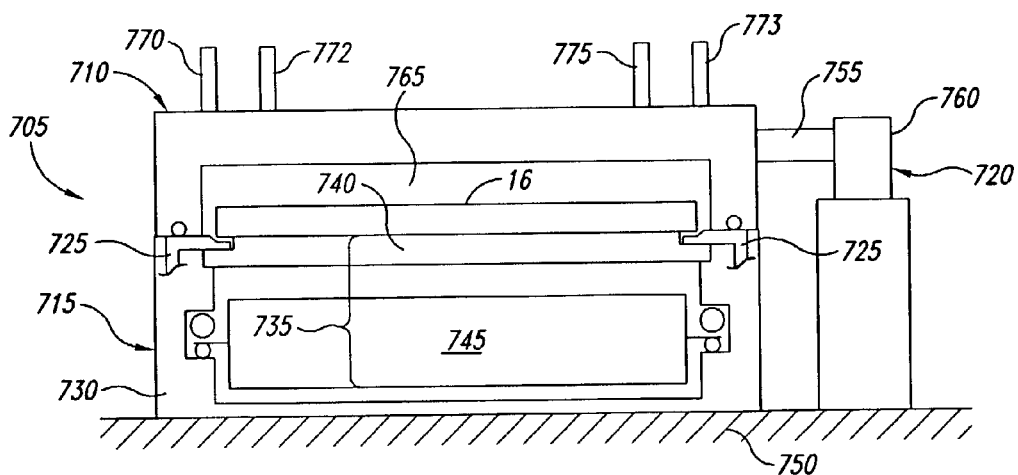

FIGS. 17 and 18, illustrate another embodiment of a thermal processing station 705. As illustrated, the thermal station 705 can include a first assembly 710, a second assembly 715, and one or more actuators 720 that are connected to provide relative movement between the first assembly 710 and second assembly 715. The configuration of the thermal station 705 shown here may be constructed to occupy a smaller amount of space than some conventional arrangements, which can improve the versatility of the station.

In the illustrated embodiment, the second assembly 715 can include one or more components 725 that are adapted to receive a single workpiece W from an automated workpiece transfer mechanism, such as a robot having an end effector that can grasp and release the workpiece 16. The second assembly 715, for example, may include a second assembly housing 730 having an upper rim from which one or more workpiece support members 725 extend. The workpiece support members 725 may have different configurations. For example, a single workpiece support member 725 may be formed as a continuous ring having a lip or the like upon which the workpiece 16 is set by the workpiece transfer mechanism. Alternatively, a plurality of workpiece support members 725 may be discrete fingers disposed at various angular positions corresponding to the peripheral edge of the workpiece W. The angular positions of such discrete fingers can be configured to ensure access by the workpiece transfer mechanism. Other configurations for the workpiece support may likewise be suitable.

The second assembly 715 can have an interior region in which a thermal transfer unit 735 is disposed. The thermal transfer unit 735, in turn, can include a heater 740 and a heat sink 745. The heater 740 may have a relatively low thermal mass so that its temperature response time is fast enough for thermally processing the workpiece 16 within a reasonably defined time period. Further, the heat sink 745 may have a relatively high thermal mass when compared to the heater 740 so that the heat sink 745 can cool the heater 740 within a reasonably defined time period. If desired, the thermal capacity of the heat sink 745 can be greater than the sum of the thermal capacities of the heater 740 and the workpiece 16. The heat sink 745 can also include a highly heat conductive material, such as copper. As used herein, the term thermal mass refers to the product of material density and specific heat, and the term thermal capacity refers to the product of the thermal mass and the material volume.

The actuator 720 provides relative movement between the first assembly 710 and the second assembly 715. In the illustrated configuration, the actuator 720 is connected to move the first assembly 710 to and from engagement with the second assembly 715. More particularly, the actuator 720 can include a lower portion that is in fixed positional alignment with the second assembly 715 since both are secured to a common deck 750. A transversely extending arm 755 can extend from an upper portion 760 of the actuator 720 and engages the first assembly 710. The actuator 720 can be configured to drive the transversely extending arm 755 and the first assembly 710 between a first position in which the workpiece 16 can be loaded onto the second assembly 715 by an automated workpiece transfer mechanism (not shown), and a second position in which the first assembly 710 and second assembly 715 are disposed proximate one another to form a space or chamber in which the workpiece 16 is processed.

In operation, the actuator 720 can initially drive the first assembly 710 to the first position illustrated in FIG. 17. While in this position, the workpiece 16 can be placed onto the workpiece support members 725 of the second assembly 715 by an automated workpiece transfer mechanism, such as an articulated robot having an end effector carrying the workpiece 16. Once the workpiece 16 has been loaded onto the workpiece supports 725, the actuator 720 can drive the first assembly 710 toward the second assembly 715 to the second position illustrated in FIG. 18. The workpiece support members 725 translate congruently with the first assembly 710, through contact with the lower surface of the first assembly 710 or through independent actuation. As illustrated in FIG. 18, the workpiece 16 is deposited directly onto the surface of thermal transfer unit 735 for thermal processing. Generally, the upper surface of workpiece 16 is the device side of the workpiece while the lower surface of workpiece 16 is the non-device side that is placed in contact with the upper surface of the thermal transfer unit 735. Alternatively, the orientation of the workpiece 16 can be inverted. To secure the workpiece 16 to the upper surface of the thermal transfer unit 735 during processing, the thermal transfer unit 735 may include one or more apertures that are connected to a vacuum source that draws the lower surface of workpiece 16 against the upper surface of the thermal transfer unit 735.

In the position shown in FIG. 18, the lower portion of the first assembly 710 may engage the upper portion of the housing 730 of the second assembly 715 to form a thermal processing station 765, which may or may not be generally gas-tight. When the thermal station 705 is used for photoresist baking the workpiece, the thermal processing chamber 765 can be continuously purged with an inert gas to minimize the level of any oxidizing agents that may form an undesirable oxide with the photoresist material. To facilitate this purge, the first assembly 710 may be provided with one or more gas inlet ports 770 and one or more gas outlet ports 775. The gas inlet ports 770 may open to a manifold in the housing that, in turn, opens to a plurality of holes disposed through a lower surface of housing. Gas mixtures that are particularly suitable for reducing oxidizing agents in the processing chamber 765 include nitrogen or hydrogen forming gases (5% hydrogen/95% argon). The inert process environment inhibits surface film oxidation of the workpiece 16 at elevated temperatures, which can be enhanced by the oxygen-gettering effects of hydrogen forming gas. In processes other than thermal baking, the ports 770 and 775 may be used to provide an inlet and outlet for other gases used to process workpiece 16.

Other features may be incorporated into the thermal station 705 to make it particularly well-suited for single workpiece processing. For example, the volume of the processing chamber 765 formed by the cooperation of the first assembly 710 and second assembly 715 may be relatively small, which makes it more efficient to purge to reduce the consumption of high-purity, inert process gas. In addition, the first assembly 710 may be provided with one or more cooling fluid inlet ports 772 and one or more cooling fluid outlet ports 773 that provide a flow of cooling fluid to the housing 710 proximate to the workpiece 16 that, in turn, assists in cooling the workpiece 16.

It will be recognized that various fluid inlet and outlet ports may also be affixed to the second assembly 715. For example, fluid ports may be affixed to the second assembly 715 for use in connection with the heat sink 745. More particularly, a flow of cooling fluid may be provided directly to the heat sink 745 or to other structures of the second assembly for cooling of the heat sink 745. Furthermore, one or more exhaust ports may be disposed in the second assembly 715 for supplying and/or venting process gases. This arrangement in which the ports are affixed to the second assembly 715 has the benefit of reducing the amount of movement imparted to the ports and corresponding connectors, thereby increasing in the overall reliability of the corresponding connections.

EMBODIMENTS OF FLUID FLOW CONTROL SYSTEMS

Figure 19:
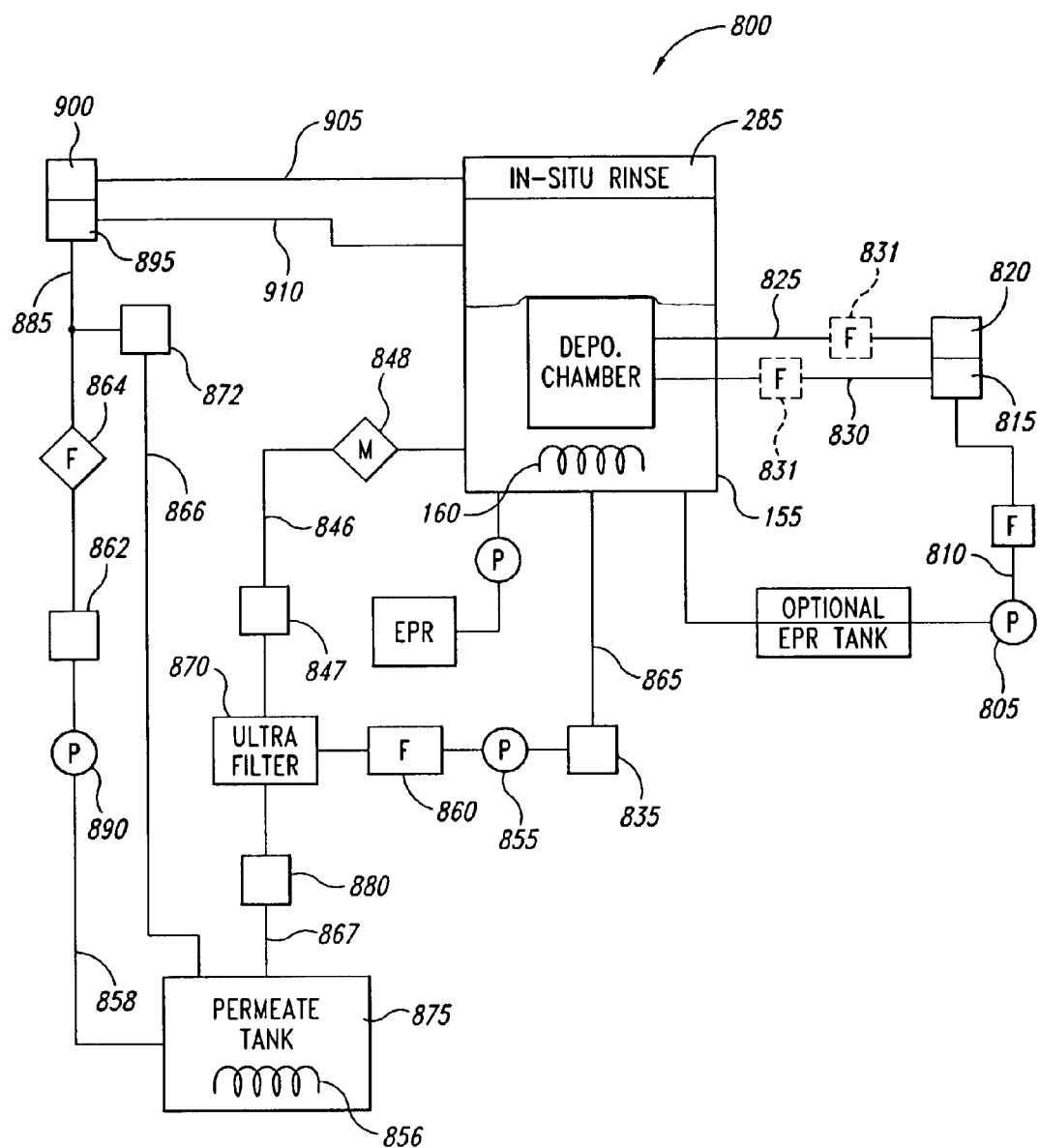
FIG. 19 illustrates one embodiment of a fluid flow control system that may be used in the processing tool of FIG. 2.

FIG. 19 illustrates one embodiment of a fluid flow control system, shown generally at 800, that may be used in connection with the processing tool 10 of FIG. 2. Although not mandatory, it is beneficial to place the fluid flow control system 800 under the control of the control system 46 (FIG. 2) so that the control system may coordinate the flow of fluid with the various other operations executed within the processing tool 10.

In the illustrated system, fluid flow begins generally in emulsion tank 155. The photoresist emulsion contained therein is maintained at a predetermined temperature by the thermal unit 160, as explained above. During normal operation, a suction is created through activation of pump 805 to draw emulsion from emulsion tank 155 through line 810 to valves 815 and 820. Valves 815 and 820 are normally open and generally lead to lines 825 and 830 which feed, for example the diffuser 220 shown in FIG. 4. Optional filters 831 can be placed in lines 825 and 830. The lines 825 and 830 generally correspond to the primary chemical delivery conduits 170a–b (FIG. 4) that provide the EPR emulsion to the processing area 215 of the reactor base 110. The fluid flow in lines 825 and 830 may be monitored by flow meters that may be in communication with the control system 46. Information regarding the rate of fluid flow can be obtained from the meters and used by the control system 46 to control the overall EPR deposition process.

Turning now to the fluid flow generated through activation of a pump 855, it can be seen that fluid is drawn from the emulsion tank 155 through a line 865 and through an open valve 835 into a particle filter 860. The particle filter 860 is chosen to remove particles within the range of 5–10 microns and separate such large particles from the flow of the photoresist chemistry. The flow of emulsion continues through the particle filter 860 and into an ultrafilter unit 870. Suitable ultrafilter units are available from Koch International Ltd. (part #P4-HFM-183-LPP). The ultrafilter unit 870 separates the flow of photoresist chemistry into a permeate solution that is drawn into a permeate tank 875 through line 867 and a concentrated emulsion that is provided through line 846. A valve 880 controls the flow through line 867, and a value 847 controls the flow through line 846. The ultrafiltration unit 870 has a semipermeable membrane filter which retains large molecules or colloidal particles while permitting the passage of water, solvents and other small molecules. In other words, it separates the photoresist emulsion into a concentrate and a permeate. The permeate solution is a conservation-type solution that is used for rinsing the contacts and workpiece. In this manner, the processing chemistry does not have to be replaced after each cleaning because the permeate can flow back into emulsion tank 155 and mix with the concentrated emulsion to be used again for deposition.

The permeate is comprised of mostly water, solvents, and other small molecules. After the permeate is separated, a concentrated emulsion is drawn through line 846 through valve 847 and through flow meter 848 to flow into the emulsion tank 155. The emulsion separated using ultrafilter 870 is of a slightly higher concentration than the emulsion in the emulsion tank because the permeate solution containing mostly water is pulled from the total bath chemistry. After ultrafiltration, the permeate solution is stored for use during a conservation in-situ rinse at a desired temperature maintained by another thermal unit 856 within the permeate tank 875. The thermal unit 856 may be of the same type and configuration as the thermal unit 160.

During in-situ rinsing and/or contact cleaning operations, fluid is drawn from the permeate tank 875 through line 858 by way of pump 890. Fluid flow from the permeate tank 875 proceeds through pump 890, valve 862, and a particle filter 864. The particle filter 864 can suitably be a 0.1 micron filter. The fluid flow continues through line 885 to valves 895 and 900. During an in-situ rinse procedure, valve 895 is closed and valve 900 is open to administer the permeate rinse through line 905 and into the in-situ rinse assembly 285. When the in-situ rinse procedure is not in operation, valve 900 is closed and valve 895 is open so that any overflow from permeate tank 875 can return to the deposition chamber through line 910. This permeate return is continued given that ultrafiltration continues through ultrafilter 870 during normal operation of the reactor 100. The permeate level in tank 875 is constantly being fed through a circuit including line 858, pump 890, valve 872, and line 866. If the recirculation flow just described exceeds capacity, excess or overflow permeate may be returned to the deposition chamber via valve 895 and line 910.

PHOTORESIST DEPOSITION PROCESS

The photoresist used in the foregoing system and reactors may be any electrodepositible resist material such as, for example, those available under the trade designation PEPR™ 2170 available from Shipley Company, Inc. (Newton, Mass.). It will be apparent to one skilled in the art that the process parameters used to electrodeposit the photoresist will vary depending upon the photoresist used. The following description of the deposition process includes parameters that may be used in connection with the PEPR™ 2170 photoresist, but they are believed to be generally applicable to the deposition of most electrophoretic photoresists or other patternable materials.

The deposition of PEPR™ 2170 is an anodic process, where the workpiece functions as the anode. The resist described here is mostly self-limiting and deposits between 5 and 12 microns of photoresist, although thicker resist films may be achieved by manipulation of the solids content and solvent content of the bath. The thickness of the resist film is controlled by varying the concentration of the plasticizer (PEPR 2170® TC, a solvent comprised mainly of octonone). The plasticizer is added by either manual or automatic dosing and has proven to be a simple, reliable means of controlling resist thickness.

EXAMPLE 1

An electrolytic bath containing 10 to 13 percent solids (PEPR™ 2170 Photoresist) and 10 percent solvents (primarily octonone or the "thickness controller" provided by The Shipley Company). The bath can contain 5 to 15 percent solids in other embodiments. No pre-cleaning steps were used and the bath was held at 30° C. A workpiece was inserted into the EPR reactor and the head was closed. The total EPR deposition process for a 200 mm workpiece in this particular example took slightly under 95 seconds (see Table 1). A first dwell step was conducted with the workpiece rotating at 75 rpm for 5 seconds, and a second dwell step was conducted with a reduction in rotation of the workpiece down to 10 rpm up to the 1 minute mark. At the 1 minute mark rotation was increased to 150 rpm and a voltage of 150 volts was applied to the electrolytic bath for the next 30 seconds. At the 90 second mark, the head was lifted to approximately 700 cts out of level and rotation of the workpiece was slowed to 75 rpm. A spin-off step was then conducted at 200 rpm for 3 seconds. (See Table 1).

EXAMPLE 2

An electrolytic bath containing 10–13% solids (PEPR™ 2170 photoresist) and 10% solvents (primarily octonone or the "thickness controller" provided by The Shipley Company). No precleaning steps were used and the bath was held at 30° C. A workpiece was inserted into the EPR processing chamber when the head of the chamber was held in a cracked position at an angle of 700 cts out of level. The total EPR deposition process for a 200 mm workpiece in this particular example took slightly under 95 seconds (see Table 2). A spin up step was initiated for 5 seconds while the workpiece was spinning at an rpm of 60 with the head in a cracked position. Next, a dwell step was performed with the head closed for a period of 1 minute with a rotation of 60 rpm wherein vibration was applied to the head for the final 10 seconds of the dwell step. Voltage was applied at the 80 second mark with a potential of 150 volts and the workpiece was spun at 150 rpm while vibration was applied to the reactor head (see Table 2). At the 85 second mark, the reactor head was again cracked at approximately 700 cts and the voltage was turned off while the workpiece rotated at 60 rpm for 5 seconds. The final 3 seconds of the procedure included a spin off step, where the head was cracked and the substrate was spun at 200 rpm.

TABLE 1

| Step | Name | Time | Potential | RPM | Vibration | Head Position |
|---|---|---|---|---|---|---|
| 1. | Spin Up | 0:05 | | 75 | No | Closed |
| 2. | Dwell | 1:00 | | 10 | No | Closed |
| 3. | Deposit | 0:15 | 150 volts | 150 | No | Closed |
| 4. | Lift | 0:05 | | 75 | No | Cracked |
| 5. | Spin Off | 0:03 | | 200 | No | Cracked |

TABLE 2

| Step | Name | Time | Potential | RPM | Vibration | Head Position |
|---|---|---|---|---|---|---|
| 1. | Spin Up | 0:05 | | 60 | No | Cracked |
| 2. | Dwell | 1:00 | | 60 | Yes (for the last 10 seconds) | Closed |
| 3. | Deposit | 0:15 | 150 volts | 150 | Yes | Closed |
| 4. | Lift | 0:05 | | 60 | No | Cracked |
| 5. | Spin Off | 0:03 | | 200 | No | Cracked |

ADDITIONAL EMBODIMENTS OF PROCESSING STATION LAYOUTS

Figure 20:
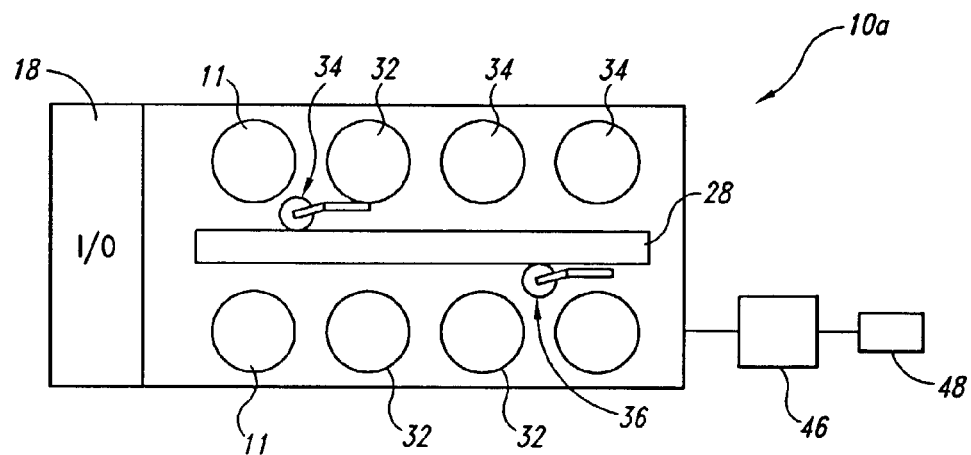
FIGS. 20–22 are top plan schematic views illustrating additional embodiments of integrated tools in accordance with other embodiments of the invention.
Figure 21:
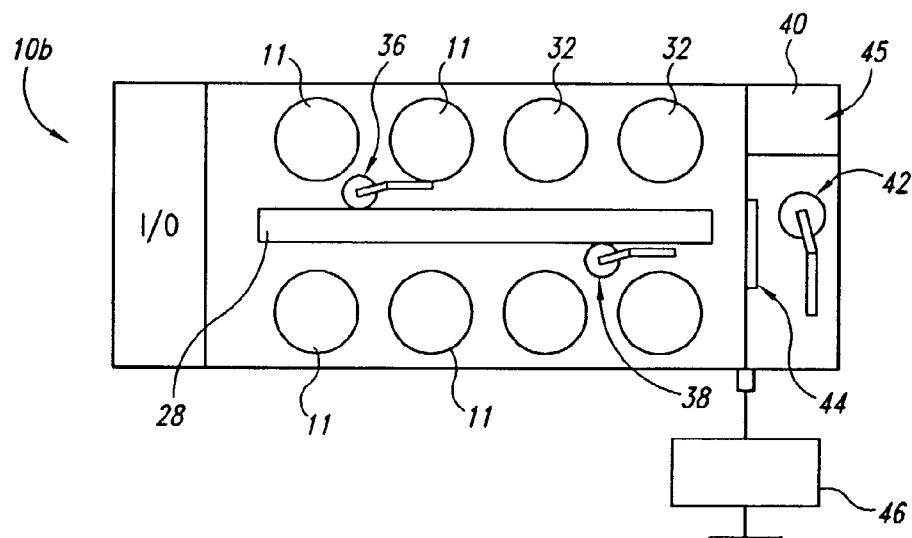
Figure 22:
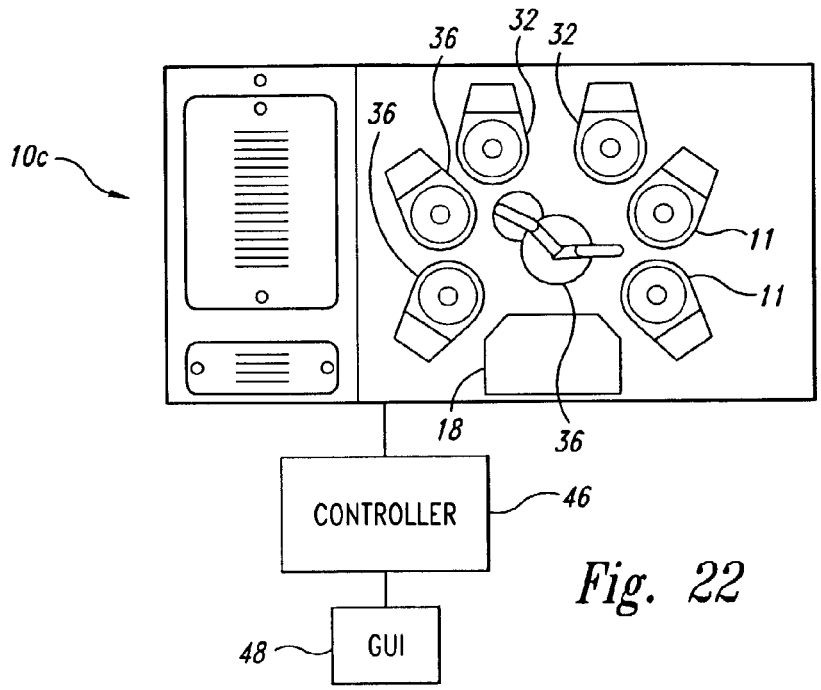

FIGS. 20–22 illustrate alternate layouts for processing stations in EPE deposition tools in accordance with additional embodiments of the invention to implement an automated EPE deposition process. With specific reference to FIG. 20, tool 10a comprises EPE deposition stations 11, the load/unload station 18, one or more fluid processing stations 32, and a thermal processing station 34. The fluid processing stations 32 may execute one or several process sequences, such as pre-wetting the workpiece prior to EPR deposition, cleaning the workpiece subsequent to EPR deposition, developing the EPR coating following patterning, depositing a metallization layer on the workpiece, enhancing the seed layer prior to either EPR deposition or metallization deposition, and so forth.

The workpieces are transferred between the processing stations 11, 34 and 32 using one or more robotic transfer mechanisms 36, 38 that are disposed for linear movement along a central track 28. All of the processing stations, as well as the robotic transfer mechanism, are disposed in a cabinet, such as the one shown in FIG. 2. The cabinet can be provided with filtered air at a positive pressure to thereby limit airborne contaminants that may reduce the effectiveness of the workpiece processing. To further enhance the resistance of the overall process to cross-contamination between processing stations, the robotic transfer mechanisms 36 and 38 may be dedicated to specific processing stations.

FIG. 21 illustrates another embodiment of a processing tool 10b in which a processing station 40 is located in a separate portion of the integrated tool set. Unlike the embodiment of FIG. 20, in this embodiment, at least one processing station, such as a thermal processing station, is serviced by a dedicated robotic mechanism 42. The dedicated robotic mechanism 42 accepts workpieces that are transferred to it by the robotic transfer mechanisms 36 and/or 38. Transfer may take place through an intermediate staging door/area 44. As such, it becomes possible to separate one portion of the workpiece processing tool, such as the thermal processing portion 45, from other portions of the tool. Additionally, using such a construction, the illustrated further processing station may be implemented as a separate module that is attached to upgrade an existing tool set. For example, processing portion 45 may be added to an existing electrochemical metallization deposition tool so that the metallization deposition and the EPR deposition take place in the same processing tool. It will be recognized that other types of processing stations may be located in portion 45 in addition to or instead of the thermal processing station 40.

Other types of processing tool layouts may also be used. For example, in certain tools sold under the brand name Equinox(™) available from Semitool, of Kalispell, Mont., the processing stations are disposed radially about a centrally located robotic transfer mechanism and a load/unload station. This platform is illustrated in FIG. 22. As illustrated in FIG. 22, a rotary tool 10c may include the same basic processing stations and similar robotic transfer apparatus to the linear tool. Accordingly, the same reference numerals are utilized here. Additional configurations are possible, such as those used in the processing tools available from Applied Materials of Santa Clara, Calif., and Novellus, Inc., of Portland, Oreg.

The robotic transfer mechanisms 36, 38 and 42 as well as the actuatable components of the processing stations 11, 34, 32 and 40 are in communication with the control unit 46 that implements software programming in response to user input parameters. It will be recognized, that a number of control units 46 may be connected to a common control system (not illustrated) that is used to control and oversee the operations performed in the microfabrication facility or sections thereof. Among its many functions, the control system 46 is programmed to control the transfer of microelectronic workpieces between the various processing stations and between the input/output section and the processing stations. Further, the control unit 46 is programmed to control the operation of the components at the individual processing stations to implement specific processing sequences in response to the user input parameters.

ADDITIONAL EMBODIMENTS OF CONTROL SEQUENCES

Figure 23:
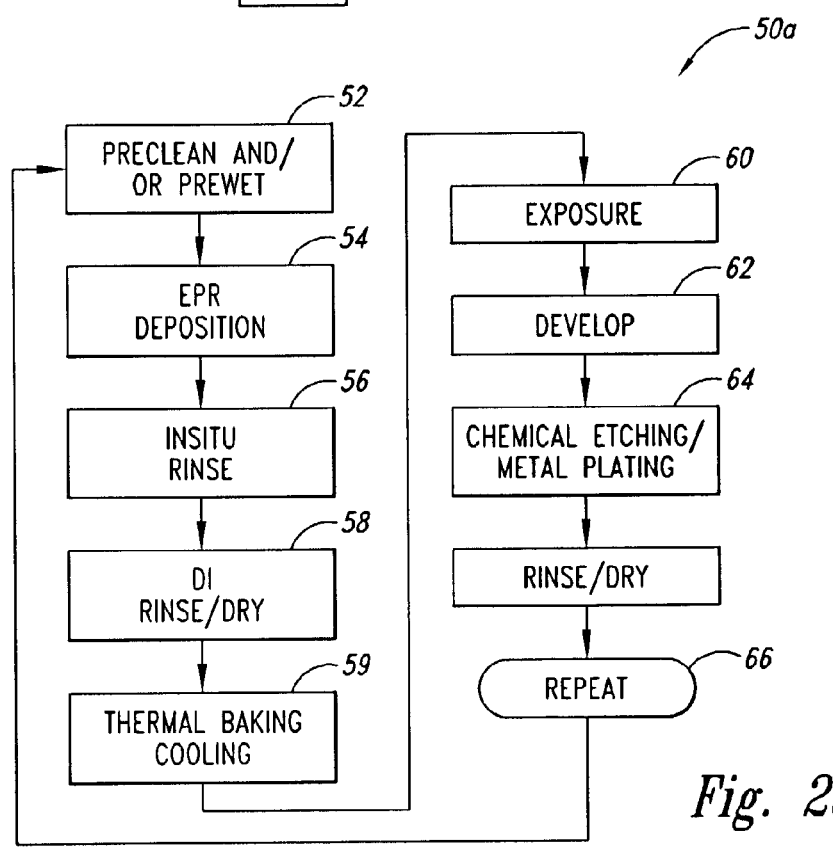
FIG. 23 is a flow diagram of another control sequence for electrophoretic deposition and photoresist processing in accordance with additional embodiments of the invention.

FIG. 23 is a flow diagram illustrating a control sequence 50a in accordance with another embodiment of the invention. In addition to the control sequence 50 described above in FIG. 3, subsequent processes of the control sequence 50a that may be executed on the microelectronic workpiece include an exposure procedure 60 followed by a photoresist development procedure 62. Although the exposure procedure 60 and the development procedure 62 may be implemented in the processing tool 10 (FIG. 2), it is more frequently executed in a separate tool. After the exposure procedure 60 and the development procedure 62 have been executed, the microelectronic workpieces may be transferred back to the processing tool 10 for execution of a chemical etching and/or metallization plating operations 64. As shown at stage 66, the overall process may be repeated as necessary until the desired structures are formed on or in the substrate.

It should be understood that the present invention may be practiced in many different ways and that the description above is merely exemplary. The description is not intended to limit the invention in any way to the illustrated embodiments. Rather, it is the intention of the inventors to both literally and through equivalents encompass all changes and improvements that validly fall within the bound of the claims below.

We claim:

1. An integrated tool for processing a microelectronic workpiece, comprising:
   a cabinet;
   an electrophoretic emulsion (EPE) deposition station in the cabinet, the EPE deposition station having a reactor including a cup configured to contain an EPE and a workpiece holder configured to isolate at least one region of the workpiece from EPE in the cup, wherein the reactor further includes an annular electrode and a gas control system configured to prevent bubbles at the electrode from flowing to a processing zone in the cup, and wherein the gas control system comprises an annular bubble trap extending around an interior portion of the cup and projecting radially inwardly above the electrode;
   a first wet processing station in the cabinet, the first wet processing station being configured provide a fluid to the workpiece; and
   a workpiece handling apparatus in at least a portion of the cabinet, the workpiece handling apparatus being configured to contact the region of the workpiece isolated from the EPE to transport the workpiece relative to the EPE station and the first wet processing station.

2. The integrated tool of claim 1 wherein the workpiece holder further comprises a contact assembly having an outer member configured to engage a perimeter portion of the workpiece and isolate a backside region of the workpiece from EPE contained in the reactor.

3. The integrated tool of claim 1 wherein the workpiece holder is configured to hold the workpiece at least substantially horizontal over the cup, and the workpiece holder further comprises a contact assembly having an outer member configured to engage a perimeter portion of the workpiece and isolate a backside of the workpiece from EPE contained in the reactor.

4. The integrated tool of claim 1 wherein:
   the gas control system further comprises an annual ledge projecting radially inwardly above the electrode and a vent through the cup located under the ledge; and
   the workpiece holder is configured to hold the workpiece at least substantially horizontal over the cup, and the workpiece holder further comprises a contact assembly having an outer member configured to engage a perimeter portion of the workpiece and isolate a backside of the workpiece from EPE contained in the reactor.

5. The integrated tool of claim 1 wherein the reactor of the EPE deposition station further comprises a fluid control system including a ultrafilter configured to separate EPE flowing through the reactor into a permeate solution and a concentrated electrophoretic solution.

6. The integrated tool of claim 1 wherein the reactor of the EPE deposition station further comprises:
   a fluid control system including an ultrafilter configured to separate EPE flowing through the reactor into a permeate solution and a concentrated electrophoretic solution.

7. The integrated tool of claim 1 wherein the EPE station further comprises an in-situ rinse assembly having a nozzle for directing a rinse solution against the workpiece at an elevation above the cup and a catch system to collect spent rinse solution separate from EPE contained in the cup.

8. The integrated tool of claim 1 wherein the first wet processing station comprises a pre-cleaning processing station.

9. The integrated tool of claim 1 further comprising a second wet processing station in the cabinet including a capsule configured to develop electrophoretic resist, and wherein the workpiece handling apparatus is configured to transport the workpiece relative to the second wet processing station.

10. The integrated tool of claim 1 further comprising a thermal processing station in the cabinet configured to bake a layer of deposited electrophoretic resist, and wherein the workpiece handling apparatus is configured to transport the workpiece relative to the thermal processing station.

11. An integrated tool for processing a microelectronic workpiece, comprising:
    a cabinet;
    an electrophoretic emulsion (EPE) deposition station in the cabinet, the EPE deposition station having a reactor including a processing location configured to deposit electrophoretic material onto a processing side of only a single workpiece and a fluid flow system including a ultrafilter to separate electrophoretic micelles from a permeate solution, wherein the reactor further includes an annular electrode and a gas control system configured to prevent bubbles at the electrode from flowing to a processing zone in the cup, and wherein the gas control system comprises an annular bubble trap extending around an interior portion of the reactor and projecting radially inwardly above the electrode;
    a first wet processing station in the cabinet, the first wet processing station being configured provide a fluid to the workpiece; and
    a workpiece handling apparatus in at least a portion of the cabinet to transport the workpiece relative to the EPE station and the first wet processing station.

12. The integrated tool of claim 11 wherein the workpiece holder further comprises a contact assembly having an outer member configured to engage a perimeter portion of the workpiece and isolate a backside region of the workpiece from EPE contained in the reactor.

13. The integrated tool of claim 11 wherein the workpiece holder is configured to hold the workpiece at least substantially horizontal over the cup, and the workpiece holder further comprises a contact assembly having an outer member configured to engage a perimeter portion of the workpiece and isolate a backside region of the workpiece from EPE contained in the reactor.

14. The integrated tool of claim 1 wherein: the annular bubble trap comprises an annular ledge above the electrode and the gas control system further comprises a vent under the ledge configured to entrap gases in EPE contained in the reactor; and
    the reactor further comprises a workpiece holder configured to hold the workpiece at least substantially horizontal over the cup, and the workpiece holder further comprises a contact assembly having an outer member configured to engage a perimeter portion of the workpiece and isolate a backside region of the workpiece from EPE contained in the reactor.

15. The integrated tool of claim 11 wherein the EPE station further comprises an in-situ rinse assembly having a nozzle for directing a rinse solution against the workpiece at an elevation above the cup and a catch system to collect spent rinse solution separate from EPE contained in the cup.

16. The integrated tool of claim 11 further comprising a second wet processing station in the cabinet including a capsule configured to develop electrophoretic resist, and wherein the workpiece handling apparatus is configured to transport the workpiece relative to the second wet processing station.

17. The integrated tool of claim 11 further comprising a thermal processing station in the cabinet configured to bake a layer of deposited electrophoretic resist, and wherein the workpiece handling apparatus is configured to transport the workpiece relative to the thermal processing station.

18. An integrated tool for processing a microelectronic workpiece, comprising:
- means for depositing an electrophoretic material onto a microelectronic workpiece from an electrophoretic emulsion in a deposition chamber, wherein the depositing means include a cup for containing the electrophonetic emulsion, a processing zone at which a workpiece is held at least substantially horizontally during processing, an annular electrode in the cup, and a gas control system in the cup configured to prevent bubbles at the electrode from flowing to the processing zone, and wherein the gas control system comprises an annular bubble trap extending around an interior portion of the cup and projecting radially inwardly above the electrode;
- means for performing an ancillary process on the workpiece using a fluid different than the electrophoretic emulsion in the deposition chamber;
- means for performing a wet process on the workpiece in a wet processing chamber separate from the deposition chamber; and
- means for transporting the workpiece from the deposition chamber to the wet processing chamber, the transportation means having an end-effector configured to hold a single workpiece.

* * * * *